(12) United States Patent
Ledentsov et al.

(10) Patent No.: US 7,583,712 B2
(45) Date of Patent: Sep. 1, 2009

(54) OPTOELECTRONIC DEVICE AND METHOD OF MAKING SAME

(75) Inventors: Nikolai Ledentsov, Berlin (DE); Vitaly Shchukin, Berlin (DE)

(73) Assignee: PBC Lasers GmbH, Berlin (DE)

( * ) Notice: Subject to any disclaimer, the term of this patent is extended or adjusted under 35 U.S.C. 154(b) by 0 days.

(21) Appl. No.: 11/648,551

(22) Filed: Jan. 3, 2007

(65) Prior Publication Data
US 2007/0291805 A1 Dec. 20, 2007

Related U.S. Application Data

(60) Provisional application No. 60/814,053, filed on Jun. 16, 2006.

(51) Int. Cl.
*H01S 3/13* (2006.01)
(52) U.S. Cl. .............................. 372/29.022; 372/29.02; 372/45.01; 372/50.11
(58) Field of Classification Search ............ 372/29.022, 372/29.02, 45.01, 50.11, 66, 102
See application file for complete search history.

(56) References Cited

U.S. PATENT DOCUMENTS

| 6,097,742 A * | 8/2000 | Caprara et al. ................. 372/22 |
| 2005/0040410 A1 * | 2/2005 | Ledentsov et al. ............ 257/79 |

* cited by examiner

*Primary Examiner*—Minsun Harvey
*Assistant Examiner*—Xnning Niu

(74) *Attorney, Agent, or Firm*—Ked & Associates LLP

(57) ABSTRACT

A light emitting device is disclosed that emits light from the surface in a broad spectral range and in a broad range of angles tilted with respect to the direction normal to the exit surface. An apparatus for generating wavelength-stabilized light is formed of a light-emitting device, an external cavity and at least one external mirror. Light emitted by the light-emitting device at a certain preselected angle, propagates through the external cavity, impinges on the external mirror and is reflected back. Light emitted at other angles does not impinge on the external mirror. Thus, a feedback occurs only for the light emitted at a preselected angle. Light impinged on the external mirror and reflected back undergoes interference with the emitted light. The interference can be constructive or destructive. Constructive interference results in a positive feedback. The positive feedback occurs, if light emitted by the light-emitting device is reflected back and reaches the active region in phase, i.e. if the phase matching between emitted and reflected light waves occurs. The positive feedback conditions are met at one or a few selected wavelengths within the luminescence spectrum of the active region. Then the apparatus generates wavelength-stabilized light. In different embodiments, an apparatus may operate as a wavelength-stabilized light-emitting diode, a wavelength-stabilized superluminescent light-emitting diode, or a wavelength-stabilized laser.

Various embodiments are possible which are distinguished in a way of optical coupling between a light-emitting device and an external mirror. The coupling can be realized via the far-field zone of the light emitted by the light-emitting device, via the near-field zone, or via a single epitaxial structure.

An apparatus for the frequency conversion is disclosed further comprising a non-linear crystal located within the external cavity.

18 Claims, 24 Drawing Sheets

(a)

(b)

$\vartheta = 65°$
$\Delta n = 0.2$
15 pairs (c)

$\vartheta = 55°$ (d)

$\vartheta = 40°$ (e)

$\vartheta = 0°$

OPTOELECTRONIC DEVICE AND METHOD OF MAKING SAME

REFERENCE TO RELATED APPLICATIONS

This application claims an invention which was disclosed in Provisional Application No. 60/814,053, filed Jun. 16, 2006, entitled "SURFACE-EMITTING OPTOELECTRONIC DEVICE AND METHOD OF MAKING SAME". The benefit under 35 USC § 19(e) of the United States provisional application is hereby claimed, and the aforementioned application is hereby incorporated herein by reference.

CITED DOCUMENTS

U.S. Patents

U.S. Pat. No. 7,031,360. Apr. 18, 2006. Ledentsov, N., Shchukin, V. "Titled cavity semiconductor laser (TCSL) and method of making same"

U.S. Patent Applications

Ser. No. 10/943,044. Sep. 16, 2004. Ledentsov, N., Shchukin, V. "Tilted cavity semiconductor optoelectronic device and method of making same"

Ser. no. 11/000,116. Nov. 30, 2004. Shchukin, V., Ledentsov, N. "Optoelectronic device incorporating an interference filter"

Ser. No. 11/194,181, Aug. 1, 2005. Ledentsov, N., Shchukin, V. "Tilted cavity semiconductor device and method of making same"

Other Publications

N. N. Ledentsov and V. A. Shchukin "Novel concepts for injection lasers" *SPIE Optical Engineering*, Volume 41, Issue 12, pp. 3193-3203 (2002)

N. Ledentsov, V. A. Shchukin, S. S. Mikhrin, I. L. Krestnikov, A. V. Kozhukhov, A. R. Kovsh, L. Ya. Karachinsky, M. V. Maximov, I. I. Novikov and Yu. M. Shernyakov "Wavelength-stabilized tilted cavity quantum dot laser" *Semiconductor. Science. and Technology* 19, pp. 1183-1188 (2004).

V. A. Shchukin, N. N. Ledentsov, S. S. Mikhrin, I. L. Krestnikov, A. V. Kozhukhov, A. R. Kovsh, L. Ya. Karachinsky, M. V. Maximov, I. I. Novikov, and Yu. M. Shernyakov, "Tilted Cavity Laser". In: Nanomodeling, ed. by A. Lakhtakia and S. A. Maksimenko, Proc. SPIE 5509, pp. 61-71 (2004), SPIE, Belingham, Wash.

N. N. Ledentsov, V. A. Shchukin, A. R. Kovsh, S. S. Mikhrin, I. L. Krestnikov, A. V. Kozhukhov, N. Yu. Gordeev, L. Ya. Karachinsky, M. V. Maximov, I. I. Novikov, Yu. M. Shernyakov, "Edge and Surface-Emitting Tilted Cavity Lasers", Proc. SPIE 5722, pp. 130-146 (2005).

V. A. Shchukin, N. N. Ledentsov, N. Yu. Gordeevb, L. Ya. Karachinsky,

N. V. Kryzhanovskaya, S. M. Kuznetsovb, M. B. Lifshits, M. V. Maximov, I. I. Novikov, Yu. M. Shernyakov, T. Kettler, K. Posilovic, and D. Bimberg, "High brilliance photonic band crystal lasers", Proc. SPIE 6350, pp. 635005-1-635005-15.

BACKGROUND OF THE INVENTION

1. Field of the Invention

The invention pertains to the field of semiconductor devices. More particularly, the invention pertains to light-emitting diodes, wavelength-stabilized semiconductor edge-emitting and surface-emitting lasers, optical amplifiers, photodetectors, and mode-locked lasers.

2. Description of Related Art

A prior art semiconductor diode laser, or more specifically, edge-emitting laser, is shown in FIG. 1(*a*). The laser structure (100) is grown epitaxially on an n-doped substrate (101). The structure further includes an n-doped cladding layer (102), a waveguide (103), a p-doped cladding layer (108), and a p-contact layer (109). The waveguide (103) includes an n-doped layer (104), a confinement layer (105) with an active region (106) inside the confinement layer, and a p-doped layer (107). The n-contact (111) is contiguous with the substrate (101). A p-contact (112) is mounted on the p-contact layer (109). The active region (106) generates light when a forward bias (113) is applied. The profile of the optical mode in the vertical direction z is determined by the refractive index profile in the z-direction. The waveguide (103) is bounded in the lateral plane by a front facet (116) and a rear facet (117). If a special highly reflecting coating is put on the rear facet (117), the laser light (115) is emitted only through the front facet (116).

The substrate (101) is formed from any III-V semiconductor material or III-V semiconductor alloy. For example, GaAs, InP, GaSb. GaAs or InP are generally used depending on the desired emitted wavelength of laser radiation. Alternatively, sapphire, SiC or [111]-Si is used as a substrate for GaN-based lasers, i.e. laser structures, the layers of which are formed of GaN, AlN, InN, or alloys of these materials. The substrate (101) is doped by an n-type, or donor impurity. Possible donor impurities include, but are not limited to S, Se, Te, and amphoteric impurities like Si, Ge, Sn, where the latter are introduced under such technological conditions that they are incorporated predominantly into the cation sublattice to serve as donor impurities.

The n-doped cladding layer (102) is formed from a material lattice-matched or nearly lattice-matched to the substrate (101), is transparent to the generated light, and is doped by a donor impurity. In the case of a GaAs substrate (101), the n-doped cladding layer is preferably formed of a GaAlAs alloy.

The n-doped layer (104) of the waveguide (103) is formed from a material lattice-matched or nearly lattice-matched to the substrate (101), is transparent to the generated light, and is doped by a donor impurity. In the case of a GaAs substrate, the n-doped layer (104) of the waveguide is preferably formed of GaAs or of a GaAlAs alloy having an Al content lower than that in the n-doped cladding layer (102).

The p-doped layer (107) of the waveguide (103) is formed from a material lattice-matched or nearly lattice-matched to the substrate (101), is transparent to the generated light, and is doped by an acceptor impurity. Preferably, the p-doped layer (107) of the waveguide is formed from the same material as the n-doped layer (104) but doped by an acceptor impurity. Possible acceptor impurities include, but are not limited to, Be, Mg, Zn, Cd, Pb, Mn and amphoteric impurities like Si, Ge, Sn, where the latter are introduced under such technological conditions that they are incorporated predominantly into the anion sublattice and serve as acceptor impurities.

The p-doped cladding layer (108) is formed from a material lattice-matched or nearly lattice-matched to the substrate (101), transparent to the generated light, and doped by an acceptor impurity. Preferably, the p-doped cladding layer (108) is formed from the same material as the n-doped cladding layer (102), but is doped by an acceptor impurity.

The p-contact layer (109) is preferably formed from a material lattice-matched or nearly lattice matched to the substrate, is transparent to the generated light, and is doped by an acceptor impurity. The doping level is preferably higher than that in the p-cladding layer (108).

The metal contacts (111) and (112) are preferably formed from the multi-layered metal structures. The metal contact (111) is preferably formed from a structure including, but not limited to the structure Ni—Au—Ge. Metal contacts (112) are preferably formed from a structure including, but not limited to, the structure Ti—Pt—Au.

The confinement layer (105) is formed from a material lattice-matched or nearly lattice-matched to the substrate (101), is transparent to the generated light, and is either undoped or weakly doped. The confinement layers are preferably formed from the same material as the substrate (101).

The active region (106) placed within the confinement layer (105) is preferably formed by any insertion, the energy band gap of which is narrower than that of the substrate (101). Possible active regions (106) include, but are not limited to, a single-layer or a multi-layer system of quantum wells, quantum wires, quantum dots, or any combination thereof. In the case of a device on a GaAs-substrate, examples of the active region (106) include, but are not limited to, a system of insertions of InAs, $In_{1-x}Ga_xAs$, $In_xGa_{1-x-y}Al_yAs$, $In_xGa_{1-x}As_{1-y}N_y$, or similar materials.

One of the major shortcomings of the edge-emitting laser of the prior art is the variation of the energy band gap with temperature resulting in an undesirable temperature dependence of the wavelength of emitted light, particularly for high output power operation. Another shortcoming is a broad beam divergence.

FIG. 1(b) shows schematically a prior art surface-emitting laser, particularly, a vertical cavity surface-emitting laser (VCSEL) (120). The active region (126) is put into a cavity (123), which is sandwiched between an n-doped bottom mirror (122) and a p-doped top mirror (128). The cavity (123) includes an n-doped layer (124), a confinement layer (125), and a p-doped layer (127). Bragg reflectors each including a periodic sequence of alternating layers having low and high refractive indices are used as a bottom mirror (122) and a top mirror (128). The active region (125) generates light when a forward bias (113) is applied. Light comes out (135) through the optical aperture (132). The wavelength of the emitted laser light from the VCSEL is determined by the length of the cavity (123).

The layers forming the bottom mirror (122) are formed from materials lattice-matched or nearly lattice matched to the substrate (101), are transparent to the generated light, are doped by a donor impurity, and have alternating high and low refractive indices. For a VCSEL grown on a GaAs substrate, alternating layers of GaAs and GaAlAs or layers of GaAlAs having alternating aluminum content preferably form the mirror (122).

The n-doped layer (124) of the cavity (123) is formed from a material lattice-matched or nearly lattice-matched to the substrate (101), is transparent to the generated light, and is doped by a donor impurity.

The p-doped layer (127) of the cavity (123) is formed from a material lattice-matched or nearly lattice-matched to the substrate (101), is transparent to the generated light, and is doped by an acceptor impurity.

The layers forming the top mirror (128) are formed from materials lattice-matched or nearly lattice-matched to the substrate (101), are transparent to the generated light, are doped by an acceptor impurity, and have alternating high and low refractive indices. For a VCSEL grown on a GaAs substrate, alternating layers of GaAs and GaAlAs or layers of GaAlAs having alternating aluminum content preferably form the mirror (128).

The p-contact layer (129) is formed from a material doped by an acceptor impurity. For a VCSEL grown on a GaAs substrate, the preferred material is GaAs. The doping level is preferably higher than that in the top mirror (128). The p-contact layer (129) and the metal p-contact (112) are etched to form an optical aperture (132).

The confinement layer (125) is formed from a material lattice-matched or nearly lattice-matched to the substrate (101), is transparent to the generated light, and is either undoped or weakly doped. The confinement layers are preferably formed from the same material as the substrate (101).

The active region (126) placed within the confinement layer (125) is preferably formed by any insertion, the energy band gap of which is narrower than that of the substrate (101). Possible active regions (126) include, but are not limited to, a single-layer or a multi-layer system of quantum wells, quantum wires, quantum dots, or any combination thereof. In the case of a device on a GaAs-substrate, examples of the active region (126) include, but are not limited to, a system of insertions of InAs, $In_{1-x}Ga_xAs$, $In_xGa_{1-x-y}Al_yAs$, $In_xGa_{1-x}As_{1-y}N_y$, or similar materials.

The active region (126) generates optical gain when a forward bias (113) is applied. The active region (126) then emits light, which is bounced between the bottom mirror (122) and the top mirror (128). The mirrors have high reflectivity for light propagating in the normal direction to the p-n junction plane, and the reflectivity of the bottom mirror (122) is higher than that of the top mirror (128). Thus, the VCSEL design provides a positive feedback for light propagating in the vertical direction and finally results in lasing. The laser light (135) comes out through the optical aperture (132).

One of the major advantages of a VCSEL is the temperature stabilization of the wavelength if the device operates in a single transverse mode. Temperature variations of the wavelength follow the temperature variations of the refractive index, which are an order of magnitude smaller than the variations of the semiconductor band gap energy. A severe disadvantage of a VCSEL is that its output power is limited to a few milliwatts, because it is not possible to provide efficient heat dissipation in the VCSEL geometry keeping a single transverse mode operation, and there is a difficulty in providing a high power output density suitable for the frequency conversion. Another disadvantage of a VCSEL is that the wavelength is defined by the cavity thickness giving only a little flexibility to the device.

SUMMARY OF THE INVENTION

A light emitting device is disclosed that emits light from the surface in a broad spectral range and in a broad range of angles tilted with respect to the direction normal to the exit surface. The light-emitting device contains a multilayer interference reflector (MIR), located on the side of the active region opposite from the exit surface. The reflectivity spectrum of the MIR at each angle has a maximum at a certain wavelength which depends on the angle.

An apparatus for generating wavelength-stabilized light is formed of a light-emitting device, an external cavity and at least one external mirror. Light emitted by the light-emitting device at a certain preselected angle, propagates through the external cavity, impinges on the external mirror and is reflected back. Light emitted at other angles does not impinge on the external mirror. Thus, a feedback occurs only for the light emitted at a preselected angle. Light impinged on the external mirror and reflected back undergoes interference with the emitted light. The interference can be constructive or destructive. Constructive interference results in a positive feedback. The positive feedback occurs, if light emitted by the light-emitting device is reflected back and reaches the active region in phase, i.e. if the phase matching between emitted and reflected light waves occurs. The positive feedback conditions are met at one or a few selected wavelengths within the luminescence spectrum of the active region. Then the apparatus generates wavelength-stabilized light. In a preferred embodiment, the apparatus generates wavelength-stabilized laser light. In one embodiment, the apparatus generating wavelength-stabilized light operates as a wavelength-stabilized light-emitting diode. In another embodiment, the apparatus generating wavelength-stabilized light operates as a wavelength-stabilized superluminescent diode. In yet another embodiment, the apparatus generating wavelength-stabilized light operates as a wavelength-stabilized laser. The stabilized wavelength can be selected by varying the angle between the direction from the light-emitting device to the external mirror and the normal to the exit surface of the device.

Various embodiments are possible which are distinguished in a way of optical coupling between a light-emitting device and an external mirror. One group of the embodiments includes apparatuses, wherein a light-emitted device and an external mirror are coupled via a far field zone of the light emitted by the light-emitting device.

A second group of embodiments include apparatuses, wherein an external cavity is located in a near field zone of a light-emitting device, and light generated by the light-emitting device is coupled to the external cavity via the near field zone, the external mirror is preferably located at the side of the external cavity opposite to the light-emitting device.

A third group of embodiments include apparatuses, wherein an external cavity is coupled with a light-emitting device epitaxially, and the light-emitting device, external cavity, and an external mirror belong to a single epitaxial structure.

One another embodiment includes an apparatus, wherein a light-emitting device comprises, instead of a multilayer interference reflector, an evanescent reflector. And further embodiment is possible, wherein two or more reflectors are evanescent reflectors. And yet another embodiment is possible, wherein all reflectors are evanescent reflectors.

An apparatus for the frequency conversion is disclosed comprising of a light-emitting device, an external cavity, at least one external mirror, and a non-linear crystal located within the external cavity. A light-emitting device, an external cavity, and a least one external mirror form a wavelength-stabilized laser emitting a primary wavelength-stabilized laser light. A non-linear crystal is placed within the external cavity such that the optical path of the primary light does through the non-linear crystal resulting in generating a wavelength-stabilized light of the second harmonic.

DETAILED DESCRIPTION OF THE INVENTION

Figure 1:
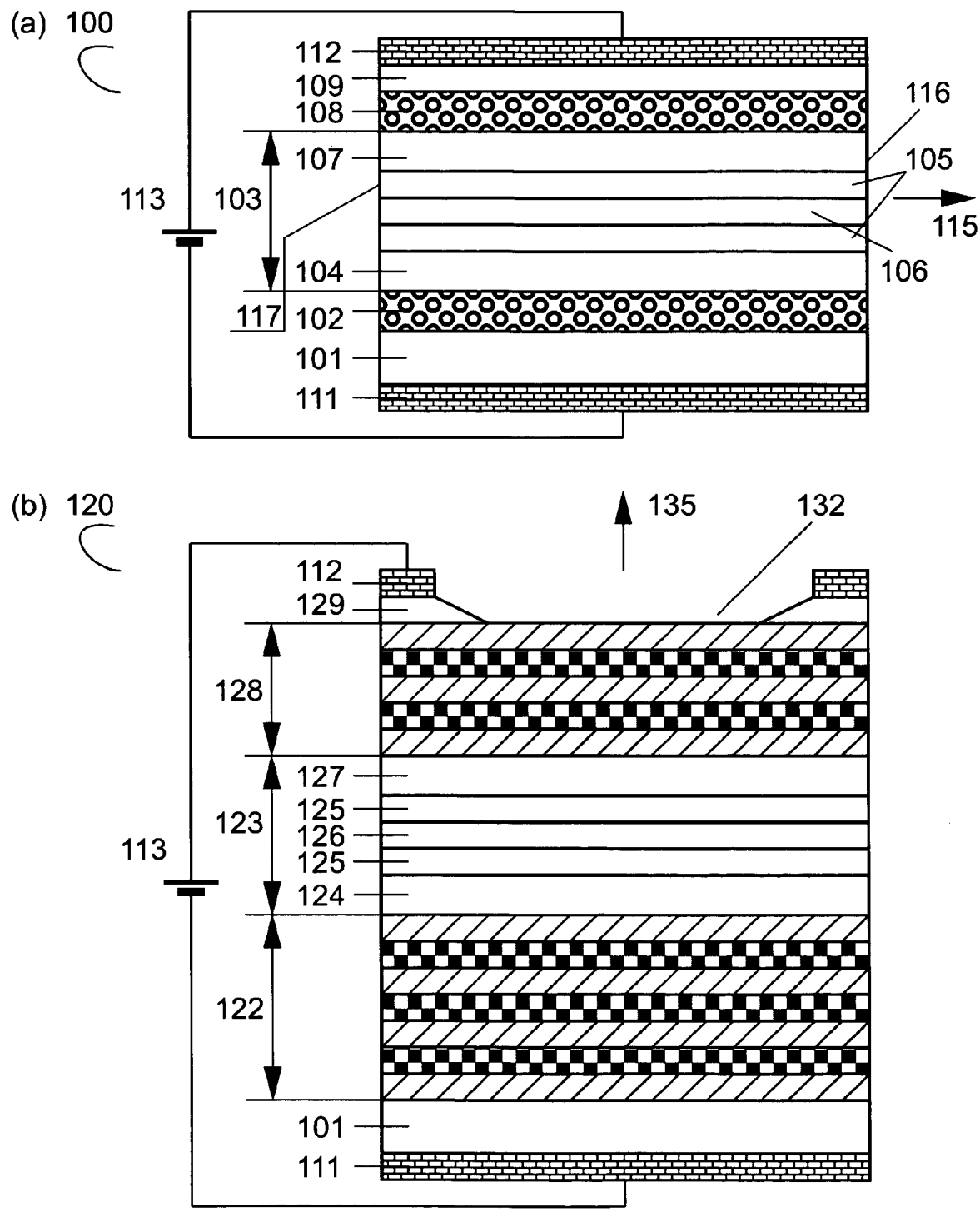
FIG. 1(a) shows a conventional prior art edge-emitting laser.
FIG. 1(b) shows a conventional prior art vertical cavity surface-emitting laser with doped mirrors.

An approach allowing to extend substantially the performance of the optoelectronic devices like semiconductor diode lasers, or light emitting diodes includes the using of a tilted optical modes. This concept is based on the fundamental physical properties of multilayered structures, i.e, on the laws of propagation, transmission, and reflection of electromagnetic waves at oblique, or tilted incidence. FIG. 2(a) shows a sample periodic multilayer structure (200). FIGS. 2(b) through 2(e) illustrate the reflectivity spectrum of a periodic multilayered structure (200) for a few different tilt angles $\vartheta$, at which the propagating TE electromagnetic wave impinges on the structure. FIG. 2(b) shows the reflectivity spectrum at the angle of incidence 65 degrees, FIG. 2(c) shows the reflectivity spectrum at the angle of incidence 55 degrees, FIG. 2(d) refers to the angle of incidence 40 degrees, and FIG. 2(e) corresponds to the normal incidence. The properties of multilayered structures at an oblique, or tilted incidence of light have been described by A. Yariv and P. Yeh, in *Optical Waves in Crystals. Propagation and Control of Laser Radiation*, Wiley, 1984. In a particular example, light impinges on the structure from the medium with a refractive index $n_1$=3.6, and the structure includes 15 periods, each period further including one layer of the $\Lambda/2$ thickness having a low refractive index $n_2$=3.4 and one layer of equal $\Lambda/2$ thickness having a high refractive index $n_1$=3.6. The reflectivity is plotted as a function of the frequency $\omega$ of the electromagnetic wave, and $\omega$ is measured in units of c/$\Lambda$, where c is the speed of light in a vacuum.

The major properties illustrated in FIGS. 2(b) through 2(e) are as follows. At the normal incidence, $\vartheta$=0, (FIG. 2(e)) the reflectivity spectrum reveals narrow spikes of a low amplitude. As the angle $\vartheta$ increases (FIGS. 2(d), 2(c), and 2(b)), spikes shift towards higher frequencies, and hence, shorter wavelengths, the amplitude of the spikes increases, and the spikes become broader, forming stopbands with a reflectivity close to 1. This property of a strong dependence of the reflectivity of electromagnetic waves from a multilayered structure on the angle of incidence is the basis of the concept of a tilted cavity semiconductor diode laser. This laser was disclosed in a U.S. Pat. No. 7,031,360 by Ledentsov et al., herein incorporated by reference. In the tilted cavity laser, light propagates at an angle with respect to multilayer interference mirrors (MIRs), and the MIRs and the cavity are optimized for tilted photon propagation.

Figure 3:
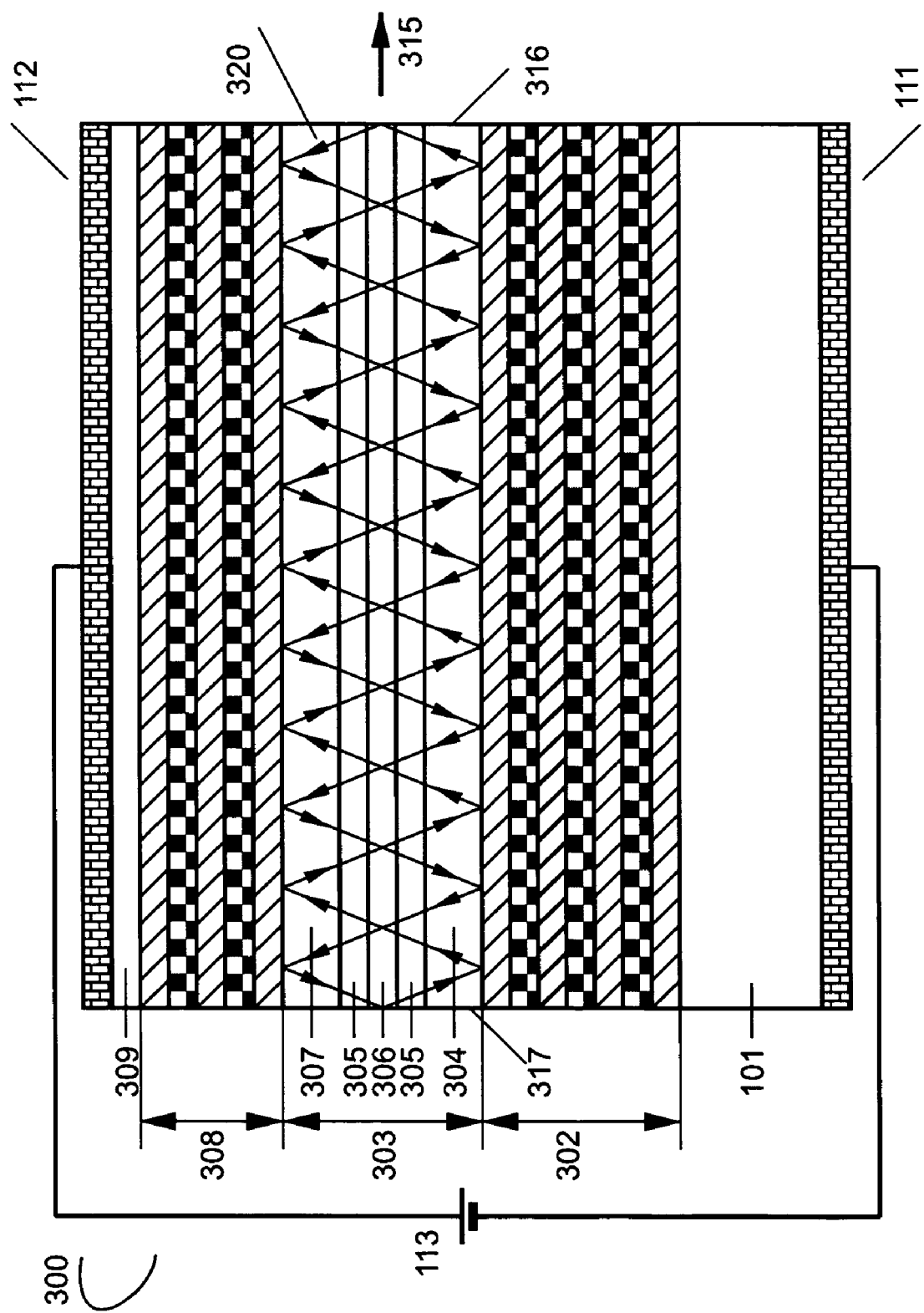
FIG. 3 shows a schematic diagram of a prior art tilted cavity laser.

The tilted cavity laser (300) shown in FIG. 3 is grown epitaxially on an n-doped substrate (101) and includes an n-doped bottom multilayered interference reflector (MIR) (302), a cavity (303), a p-doped top multilayered interference reflector (308), and a p-contact layer (309). The cavity (303) includes an n-doped layer (304), a confinement layer (305), and a p-doped layer (307). The confinement layer (305) further includes an active region (306). The laser structure (300) is bounded in the lateral plane by a rear facet (317) and a front facet (316). The cavity (303) and the multilayered interference reflectors (302) and (307) are designed such that resonant conditions for the cavity and for multilayered interference reflectors are met for only one tilted optical mode (320), the light propagating at a certain tilt angle and having a certain wavelength. If the rear facet (317) is covered by a highly reflecting coating, the output laser light (315) comes out only through the front facet (316). The property of this design of a tilted cavity laser is that wavelength stabilization and a high output power are obtained at the same time. Since the cavity (303), together with the bottom MIR (302) and the top MIR (308) are designed such that lasing occurs in a tilted optical mode, the cavity (303) is termed "tilted cavity" herein. The disadvantage of the tilted cavity laser is the fact that once the laser is fabricated, the wavelength can not be tuned or adjusted to a particular value.

The layers forming the bottom multilayered interference reflector (302) are formed from materials lattice-matched or nearly lattice matched to the substrate (101), are transparent to the generated light, are doped by a donor impurity and have alternating high and low refractive indices. For a tilted cavity laser grown on a GaAs substrate, alternating layers of GaAs and GaAlAs or layers of GaAlAs having alternating aluminum content preferably form the mirror.

The n-doped layer (304) of the cavity (303) is formed from a material lattice-matched or nearly lattice-matched to the substrate (101), is transparent to the generated light, and is doped by a donor impurity.

The p-doped layer (307) of the cavity (303) is formed from a material lattice-matched or nearly lattice-matched to the substrate (101), is transparent to the generated light, and is doped by an acceptor impurity.

The layers forming the top multilayered interference reflector (308) are formed from materials lattice-matched or nearly lattice-matched to the substrate (101), are transparent to the generated light, are doped by an acceptor impurity, and have alternating high and low refractive indices. For a tilted cavity laser grown on a GaAs substrate, alternating layers of GaAs and GaAlAs or layers of GaAlAs having alternating aluminum content form the mirror.

The p-contact layer (309) is formed from a material doped by an acceptor impurity. For a tilted cavity laser grown on a GaAs substrate, the preferred material is GaAs. The doping level is preferably higher than that in the top multilayered interference reflector (308).

The confinement layer (305) is formed from a material lattice-matched or nearly lattice-matched to the substrate (101), is transparent to the generated light, and is either undoped or weakly doped. The confinement layers are preferably formed from the same material as the substrate (101).

The active region (306) placed within the confinement layer (305) is preferably formed by any insertion, the energy band gap of which is narrower than that of the substrate (101). Possible active regions (306) include, but are not limited to, a single-layer or a multi-layer system of quantum wells, quantum wires, quantum dots, or any combination thereof. In the case of a device on a GaAs-substrate, examples of the active region (306) include, but are not limited to, a system of insertions of InAs, $In_{1-x}Ga_xAs$, $In_xGa_{1-x-y}Al_yAs$, $In_xGa_{1-x}As_{1-y}N_y$ or similar materials.

To describe the operation of the tilted cavity laser (300), it is important to introduce the effective mode angle of the optical modes.

Effective Angle of Optical Modes

In most of the embodiments of the present invention, a light-emitting device includes a multilayered structure, in which a refractive index is modulated in the direction perpendicular to the p-n junction plane. The coordinate reference frame is hereby defined such that the p-n junction plane is the (xy) plane. The refractive index n is modulated in the z-direction, n=n(z). Then, in any optical mode, the temporal and spatial behavior of the electric (E) and magnetic (H) fields is written as follows, $$\tilde{E}_i(x,y,z;t)=Re[exp(-i\omega t)exp(i\beta_x x+i\beta_y y)E_i(z)], \quad (1a)$$

$$\tilde{H}_i(x,y,z;t)=Re[exp(-i\omega t)exp(i\beta_x x+i\beta_y y)H_i(z)], \quad (1b)$$

where ω is the frequency of light, $\beta_x$ and $\beta_y$ are propagation constants, Re stands for the real part of a complex number, and the index i=x, y, z. Let the axes x and y be defined such that the propagation constants are $$\beta_x=\beta \text{ and } \beta_y=0. \quad (2)$$

Then, for TE optical modes the Maxwell's equations reduce to a scalar equation for the only non-zero component of the electric field, $E_y(z)$, $$-\frac{d^2}{dz^2}E_y(z) + \beta^2 E_y(z) = n^2(z)\frac{\omega^2}{c^2}E_y(z), \quad (3)$$

as shown previously by H. C. Casey, Jr. and M. B. Panish in *Heterostructure Lasers, Part A*, Academic Press, New York, 1978, pp. 34-57. Most practical structures used in optoelectronic devices are layered structures where the refractive index within each i-th layer is constant, and $$n(z)=n_i. \quad (4)$$

Then the solution of Eq. (3) within the i-th layer may be written as a linear combination of two waves, $$E_y(z)=A exp(q_i z)+B exp(-q_i z), \quad (5a)$$

where $$q_i = \sqrt{n_i^2 \frac{\omega^2}{c^2} - \beta^2}, \quad (5b)$$

if $n_i \frac{\omega}{c} > \beta$, or $$E_y(z) = C exp(\kappa_i z) + D exp(-\kappa_i z), \quad (6a)$$

where $$\kappa_i = \sqrt{\beta^2 - n_i^2 \frac{\omega^2}{c^2}}, \quad (6b)$$

if $n_i \frac{\omega}{c} < \beta$.

In the case of Eq. (5b), if the electric field within the i-th layer is a standing wave, which is a combination of two traveling waves, each of the traveling waves within this particular i-th layer propagates at an angle ϑ or -ϑ with respect to the axis z, where $$\vartheta = \tan^{-1}\frac{\beta}{q_i}. \quad (7)$$

In the case of Eq. (6b), the electric field within the i-th layer is the combination of increasing and decreasing exponentials, and it is not possible to define an angle.

Figure 2:
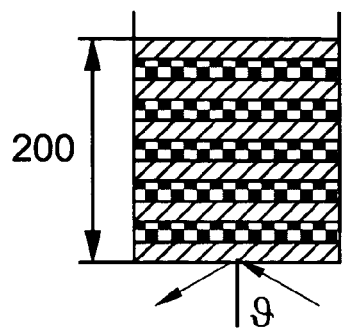
FIG. 2(a) shows schematically a periodic multilayer structure.
FIG. 2(b) shows a prior art reflectivity spectrum of a multilayered periodic structure at the angle of incidence 65 degrees.
FIG. 2(c) shows a prior art reflectivity spectrum of a multilayered periodic structure at the angle of incidence 55 degrees.
FIG. 2(d) shows a prior art reflectivity spectrum of a multilayered periodic structure at the angle of incidence 40 degrees.
FIG. 2(e) shows a prior art reflectivity spectrum of a multilayered periodic structure at normal incidence.
Figure 2:
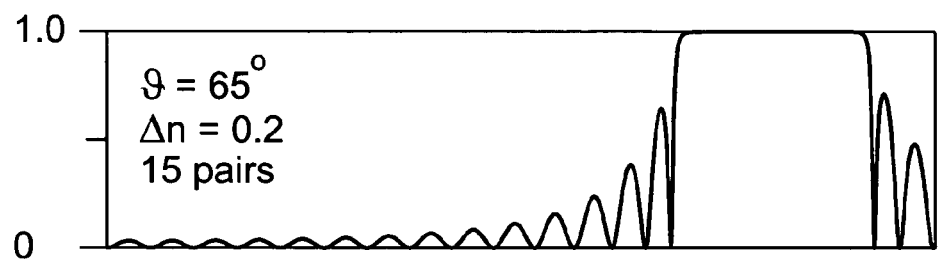
Figure 2:
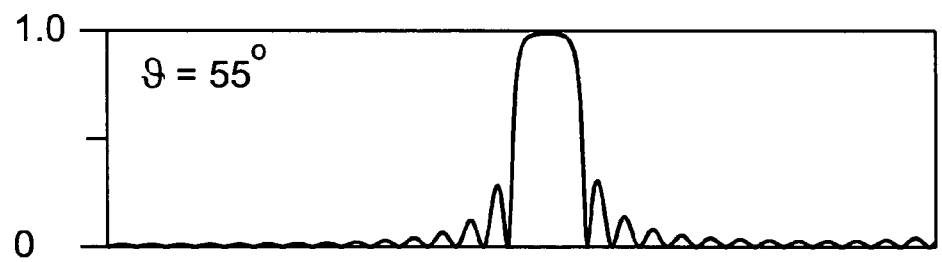
Figure 2:
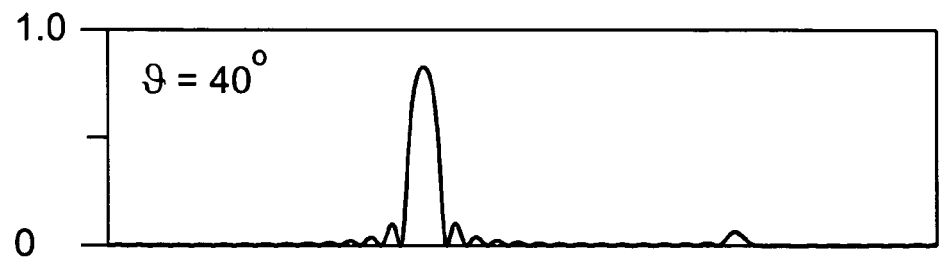
Figure 2:
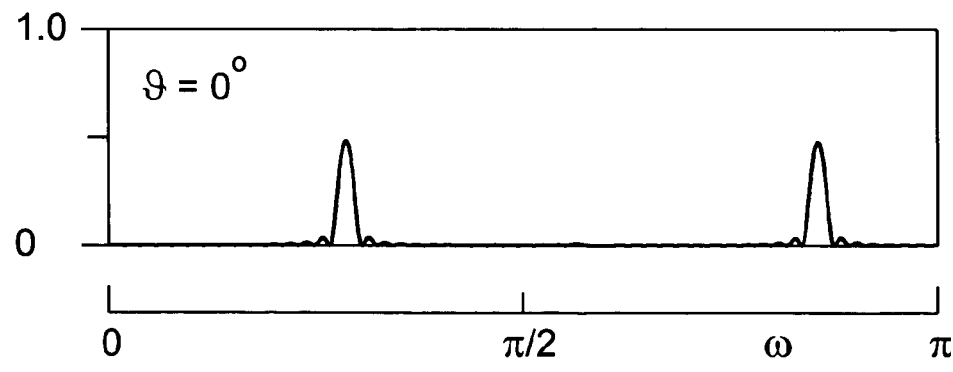

FIG. 2 shows that the optical properties, e.g. the reflection or transmission coefficients of any multilayered structure depend dramatically on the angle of incidence of the electromagnetic wave. This property of multilayered structures is employed in all embodiments of the present invention. Therefore, it is convenient to characterize any optical mode by its angle of propagation. When the angle is defined in accordance with Eq. (7), the angle is different for different layers. From hereto forward the following conventions are used. One layer is fixed as the reference layer, and its refractive index is denoted as $n_0$. It is convenient to choose for this layer a layer with a high refractive index, preferably the layer having the maximum refractive index $n_{max}$ or a layer having a refractive index close to the maximum refractive index. For example, in a multilayered structure including layers of GaAs and $Ga_{1-x}Al_xAs$, it is convenient though not necessary to choose a layer of GaAs as the reference layer. All layers of $Ga_{1-x}Al_xAs$ typically have refractive indices lower than the reference layer of GaAs, and the optical modes have propagation constants that obey the relationship $$\beta < n_{max}\frac{\omega}{c} = n_0\frac{\omega}{c}, \quad (8)$$

and the electric field of the optical modes within the reference layer are a combination of traveling waves according to Eq. (5a). Thus, it is possible to define the angle of propagation within the layer of GaAs, according to Eq. (7).

If InAs or GaInAs layers, for example, in quantum well, quantum wire or quantum dot layers, are present in the structure, their refractive indices may be higher than that of GaAs. However, their thickness is typically very small, and these layers do not make a dramatic impact on the propagation constants β of the optical modes, and the relationship $$\beta < n_0\frac{\omega}{c}, \quad (9)$$

is still valid for the optical modes. Thus, in what follows, every optical mode is assigned an angle $\vartheta$, according to $$\vartheta = \tan^{-1}\frac{\beta}{\sqrt{n_0^2\frac{\omega^2}{c^2} - \beta^2}}, \quad (10)$$

where $n_0$ is the refractive index of the reference layer. For GaAs-based optoelectronic devices, a GaAs layer is chosen as the reference layer. It should be noted that it is possible to choose a layer as the reference layer even in the case where such a layer is not present in the structure and all layers present have refractive indices lower than that of the reference layer. For example, if the structure includes the layers of $Ga_{1-x}Al_xAs$ with different values of aluminum composition x, and no layer of GaAs is present in the structure, it is still possible to choose a layer of GaAs as the reference layer in order to define the angle $\vartheta$.

The major advantage of describing the optical modes by an angle $\vartheta$ relates to the following. When a complete layered structure of the optoelectronic device is considered, the optical modes are found from the solution of Eq. (3). Then each optical mode has its propagation constant β and the corresponding angle of propagation $\vartheta$ defined according to Eq. (10). In this case describing the optical modes by their propagation constants or by the angles is equivalent.

A striking difference arises when optical properties of a single element of a device, and not of the whole device, are considered. Then the optical modes are not defined for a single element. However, optical properties of a single element are described, if one considers the reflectivity spectrum of this element at a certain angle of incidence. For example, a method is described below for constructing a tilted cavity laser including at least one cavity and at least one multilayered interference reflector (MIR). The cavity and the MIR are designed such that the cavity has a narrow dip in the reflectivity spectrum, and the MIR has a stopband in the reflectivity spectrum, and at a certain optimum tilt angle, the cavity dip and the maximum stopband reflectivity coincide at a certain wavelength. As the tilt angle deviates from the optimum angle, the cavity dip and the maximum stopband reflectivity draw apart. Such an approach ensures the selectivity of the leaky loss and provides wavelength-stabilized operation of the laser.

It is important to specify certain terminology. For a given optical mode characterized by a tilt angle $\vartheta$, the electric field in other layers are either oscillating, as in Eq. (5a), or is a linear combination of exponentially increasing and exponentially decreasing exponents, as in Eq. (6a). This allows terminology to be specified for mirrors or reflectors. If a mirror includes one or a plurality of layers, in each of which the electric field of the given optical mode is a linear combination of exponentially increasing and exponentially decreasing exponents, similar to Eq. (6a), this mirror is designated a total internal reflector, or an evanescent reflector. If a mirror includes one or a plurality of layers, and in at least one of the layers the electric field of a given optical mode exhibits an oscillatory behavior according to Eq. (5a), this mirror is designated an interference reflector. As most of the embodiments include a reflector with a plurality of layers, the present invention deals mostly with a multilayered interference reflector (MIR). It should be noted that the same single-layered or multi-layered structure is either an evanescent reflector or an interference reflector depending on the optical mode.

Prior Art Wavelength Stabilized Laser

Figure 4:
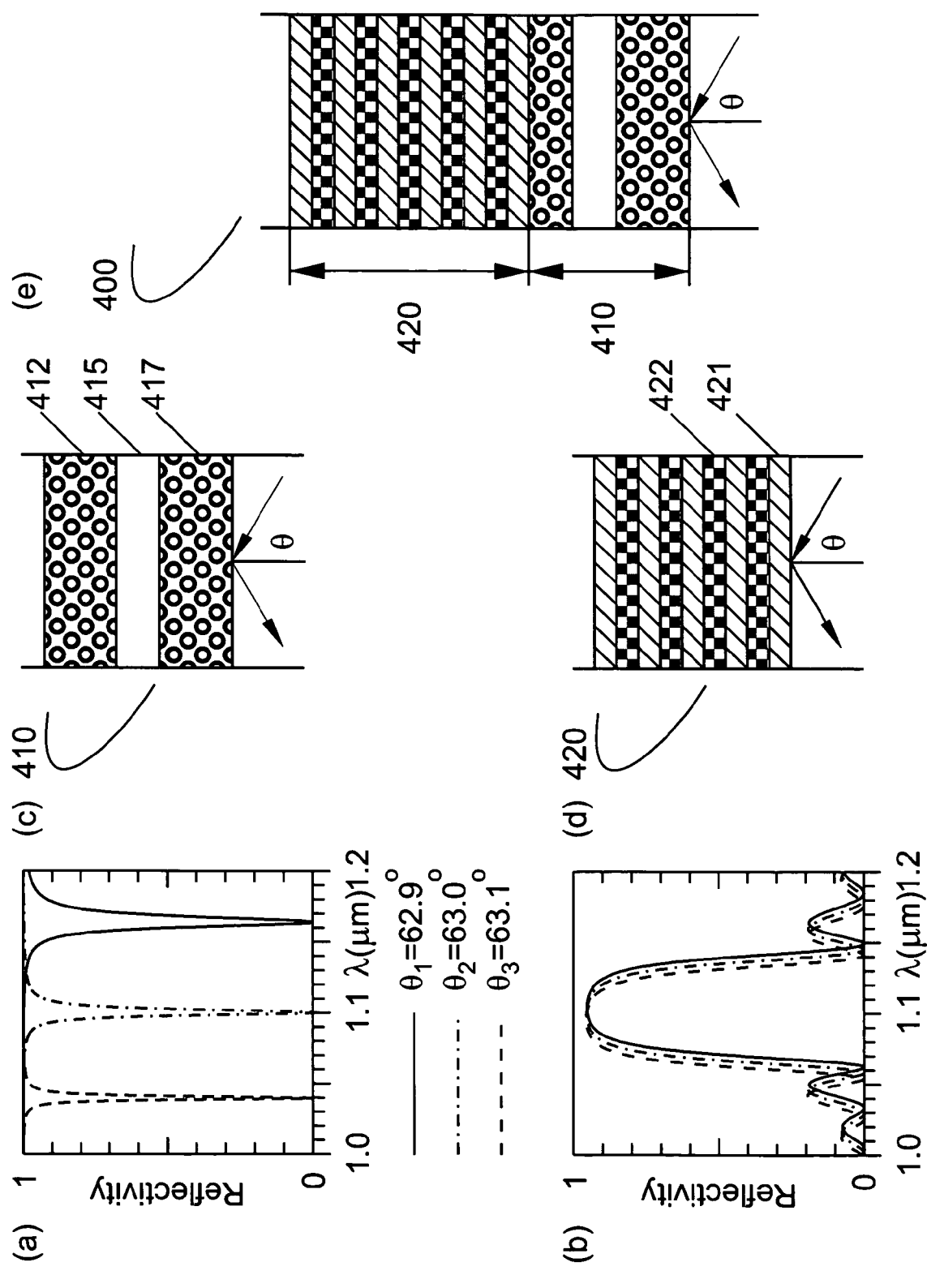
FIG. 4(a) shows the reflectivity spectrum of a high-finesse cavity at three different angles of incidence showing a strong shift of the cavity dip with the angle.
FIG. 4(b) shows the reflectivity spectrum of a multilayered interference reflector at three different angles of incidence showing a weak shift of the stopband maximum with the angle.
FIG. 4(c) shows a high-finesse cavity.
FIG. 4(d) shows a multilayered interference reflector.
FIG. 4(e) shows a waveguide of a tilted cavity laser.

FIG. 4 illustrates the principle of the wavelength stabilization in a tilted cavity laser (300), according to the U.S. Pat. No. 7,031,360 and the U.S. patent application Ser. No. 10/943,044, invented by the inventors of the present invention. The wavelength stabilization is based on the selectivity of leaky loss to the substrate as a function of the wavelength. The leaky loss is related to the dip width in the reflectivity spectrum of a structure. FIG. 4(c) shows schematically a cavity (410) a tilted cavity laser structure. This is a high-finesse cavity (410), where a high-index layer (415) is sandwiched between two low-index layers (412) and (417) such that for a given tilt angle θ, the optical mode exists in the layers (412) and (417) in the form of an evanescent wave. This means that the tilt angle θ exceeds the angle of total internal reflectance at the boundary between the reference layer and each of the low-index layers (412) and (417).

FIG. 4(a) shows the reflectivity spectra of a high-finesse cavity at three different values of the tilt angle θ. The parameters of the cavity, shown schematically in FIG. 4(c), are as follows. The layer (415) has a thickness of 365 nm and is formed of $Ga_{1-x}Al_xAs$ with x=0.6. The layers (412) and (417) have a thickness of 1000 nm each and are formed of $Ga_{1-x}Al_xAs$ with x=0.8. The refractive indices of these layers for a wavelength of light of 1100 nm equal 3.1688 and 3.0585 respectively. A major feature of the reflectivity spectra of FIG. 4(a) is a fast shift of the dip position with the angle, about 600 nm/degree.

FIG. 4(d) shows schematically a multilayered interference reflector (420) including a periodic structure of alternating layers of high (421) and low (422) refractive indices. FIG. 4(b) shows schematically the reflectivity spectra of the multilayered interference reflector of FIG. 4(d) at three different angles. The parameters of the multilayered interference reflector are as follows. The layer (421) is formed of GaAs, and has a thickness of 174 nm. The layer (422) is formed of $Ga_{1-x}Al_xAs$ with x=0.1 and has a thickness of 187 nm. The refractive indices for a wavelength of 1100 nm equal 3.4812 and 3.4328, respectively. A major feature of the reflectivity spectra of FIG. 4(b) is a relatively slow shift of the reflectivity maximum with the angle, about 100 nm/degree.

FIG. 4(e) shows schematically a structure (400) composed of the high-finesse cavity (410) and the multilayered interference reflector (420). A major property of this structure is that the features in the reflectivity spectra of two constituents shift with the angle θ with strongly different rates. Thus, if these features coincide with the wavelengths at a certain angles, two constituents are driven apart as the angle changes. Thus, the reflectivity spectrum of the composed structure has a relatively narrow dip at a certain angle and a certain wavelength, and this dip significantly broadens at a different angle. Table 1 illustrates the resulting dip width:

| Wavelength λ, nm | Dip width Δλ, nm |
|---|---|
| 1160 | >8 |
| 1140 | >4 |
| 1100 | 1.4 |
| 1060 | >7 |
| 1040 | >10 |

The mode analysis of the tilted optical modes of the structure (400) and similar tilted cavity structures confirms that the narrowing of the dip in the reflectivity spectrum corresponds to the minimum of the leaky loss as a function of the wavelength of light. The optimum wavelength, at which the loss reaches a minimum is governed by the matching conditions between a high-finesse cavity and a multilayered interference reflector. When the refractive indices change due to temperature variations, the resonant wavelength changes as well.

Figure 5:
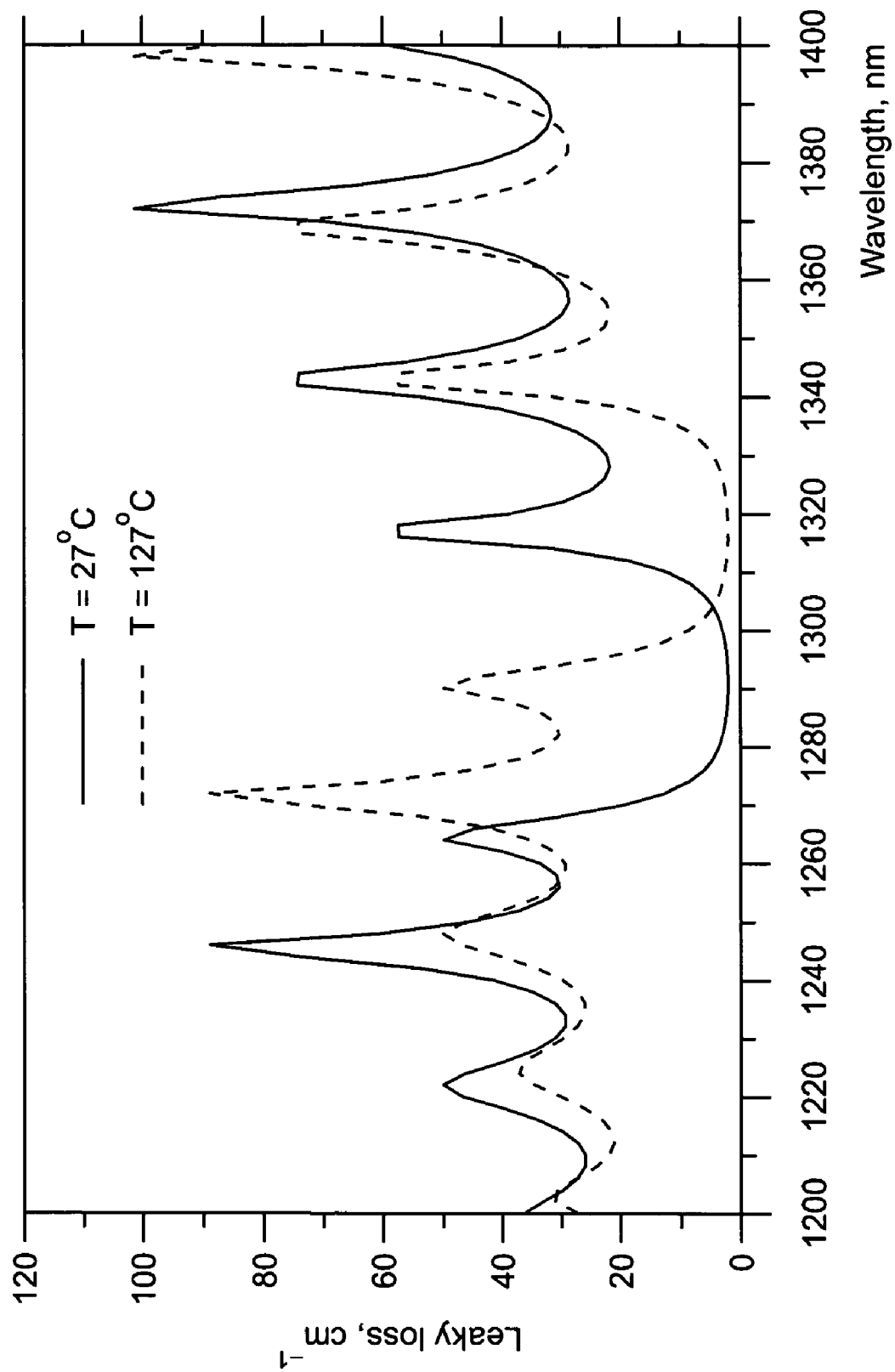
FIG. 5 shows the spectrum of leaky loss of tilted cavity laser, designed for the wavelength of 1290 nm, at two different temperatures, 27° C. and 127° C. revealing a shift of the resonant wavelength by 25 nm for the temperature shift of 100° C.

FIG. 5(a) shows a dependence of the leakage loss versus wavelength for a tilted cavity laser designed to emit laser light at 1290 μm. It is designed following the concept disclosed in the present invention, but the layer thicknesses are adjusted for a required wavelength of 1290 μm. FIG. 5(b) shows the dependence of the leakage loss versus wavelength at two temperatures, 27° C., and 127° C. The wavelength corresponding to the minimum leakage shifts by 25 nm when the temperature increases by 100 degrees. Thus, the average wavelength shift is 0.25 nm/degree. Thus, the thermal shift of the lasing wavelength in the tilted cavity laser is governed not by a fast shift of the gain spectrum which follows the thermal shift of the electronic energy band gap of a semiconductor, but rather slow shift of the refractive indices of the constituent materials.

Prior Art Device with an External Cavity

Figure 6:
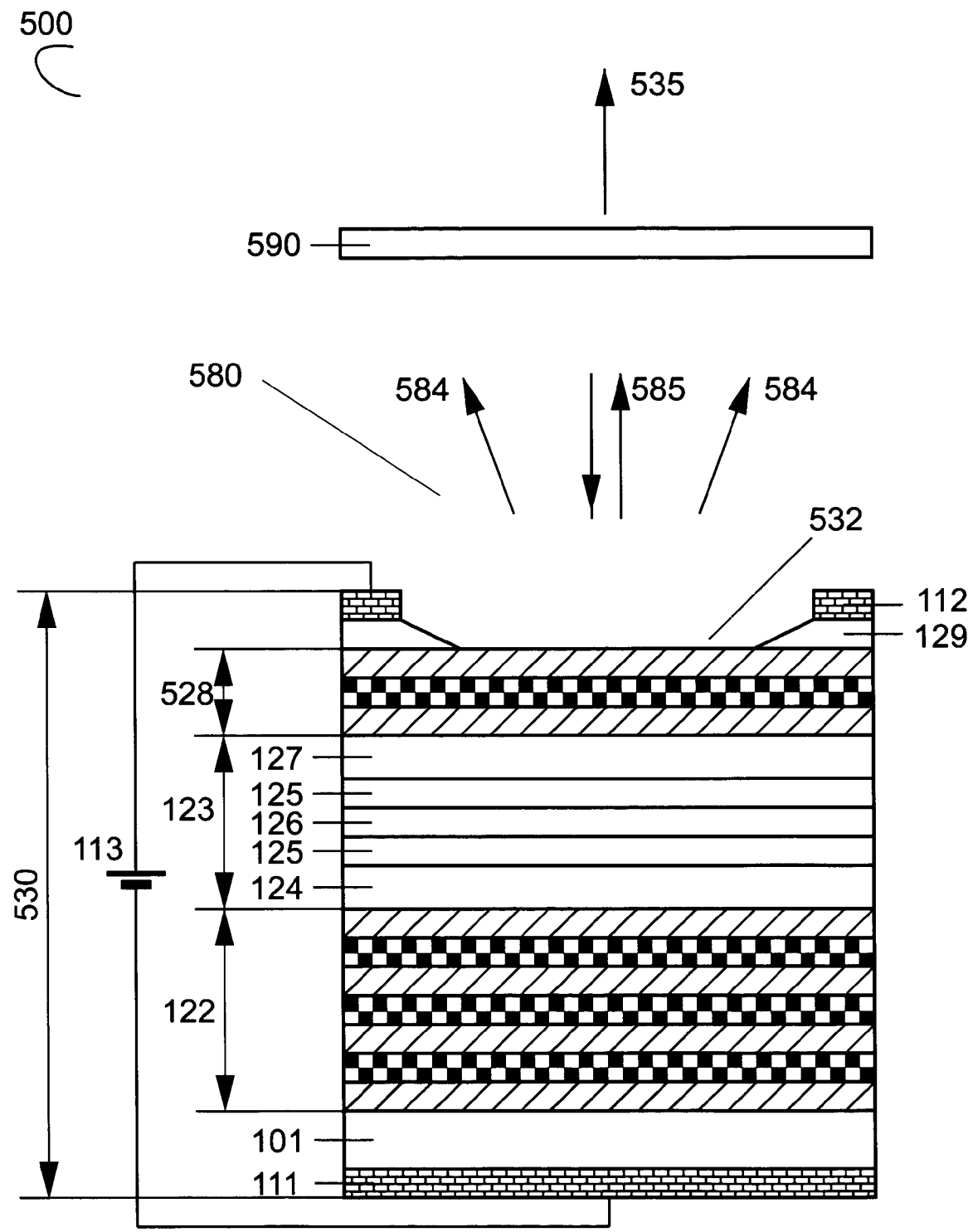
FIG. 6 shows a schematic diagram of a prior art vertical cavity surface emitting laser with an external cavity.

FIG. 6 illustrates schematically a vertical cavity surface-emitting laser with an external cavity. The apparatus (500) comprises a light-emitting device (530), an external cavity (580) bounded by the exit surface (532) of the device (530), on the one side, and an external mirror (590), on the other side. The light-emitting device (530) is grown epitaxially on the substrate (101) and comprises a bottom mirror (122), a first cavity (123), and a top mirror (528). Contrary to the VCSEL of FIG. 1(b), the top mirror (528) is rather thin and does not provide a feedback necessary for lasing. The device (530) alone operates as a light-emitting diode emitting light in a broad spectral interval and in a broad interval of angles. Light (584) emitted by the device (530) at directions other than the direction normal to the exit surface does not impinge on the external mirror (590). No feedback occurs for this light. Light (585) emitted by the device (530) at the direction normal to the exit surface, impinges on the external mirror (590), is reflected back and reaches the active region (126). Depending on the wavelength, the reflected light and the emitted light exhibit either constructive or destructive interference. For selected wavelengths, at which constructive interference occurs, a positive feedback is provided necessary for lasing. The apparatus (500) generates laser light, which comes out (535) through the external mirror (590) which is preferably semi-transparent.

Preferred Embodiments of the Present Invention

Figure 7:
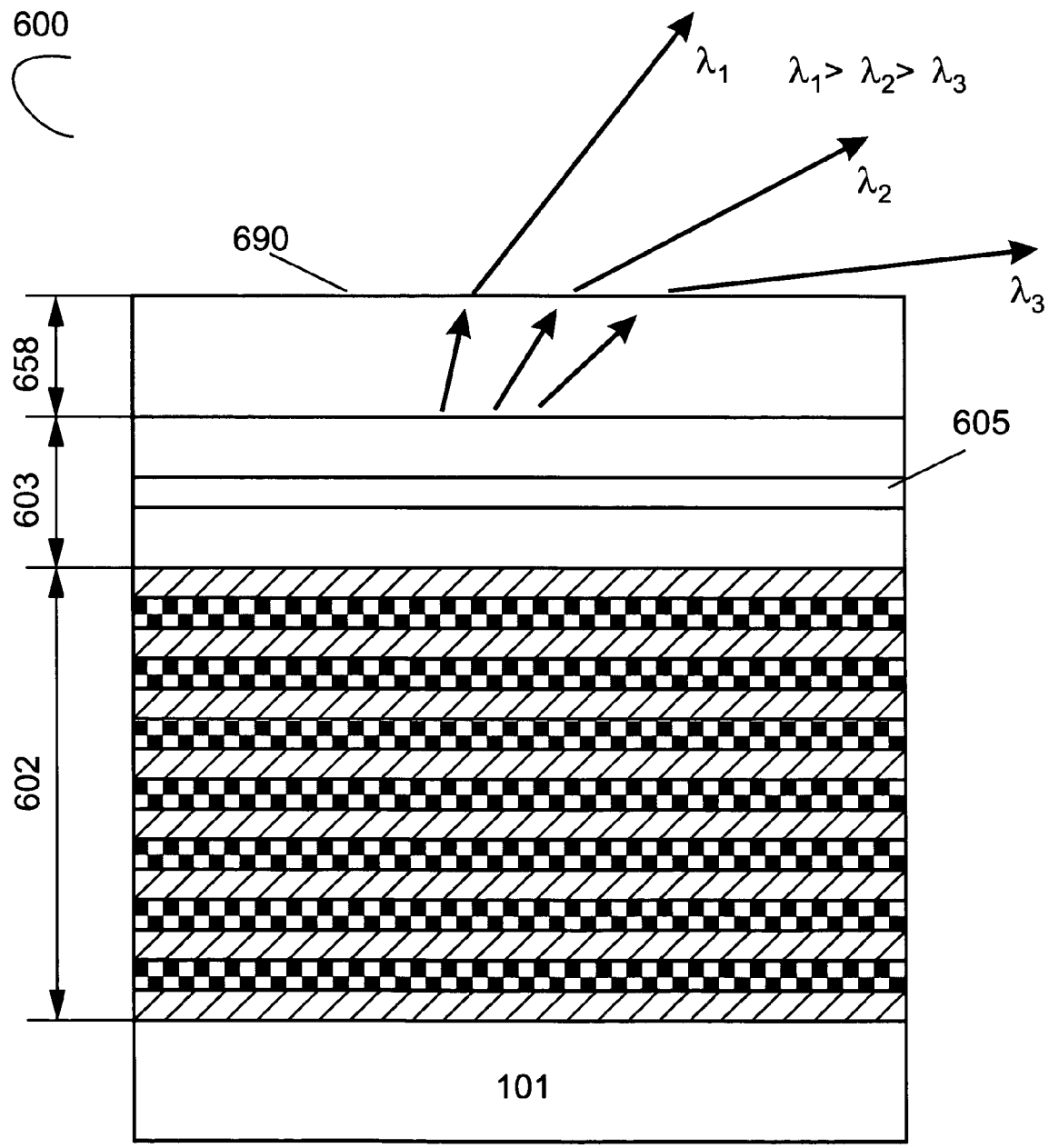
FIG. 7 shows a schematic diagram of a light-emitting device emitting light in a broad spectrum of the wavelengths and in a broad interval of angles deflected from the direction normal to the top surface of the device, according to one embodiment of the present invention.

In the present invention, propagation of light in the tilted optical modes and the properties of the modes are employed in a completely different way. FIG. 7 illustrates a light-emitting device according to one of the embodiments of the present invention. The device (600) comprises a bottom multilayer interference reflector (MIR) (602) on top of the substrate (101), an active element (603), and a top cladding layer (658). The device is grown epitaxially on the substrate (101). The p-n junction element (605) is located within the active element (603). The device operates as follows. Light is generated in the active element (603) at different wavelengths within the luminescence spectrum of the active region. The top surface of the device (690) is an exit surface. At each particular angle of propagation, the MIR (602) has a certain reflectivity spectrum. This reflectivity spectrum changes as a function of the angle. Light that goes through the MIR (602) and further to the substrate does not come out through the top surface. Thus, at a given tilt angle ϑ, the spectrum of light emitted through the top surface, is determined by the reflectivity of the MIR (602) at this angle. The maximum of the light intensity emitted at a given angle ϑ is reached at the wavelength, at which the MIR (602) reflectivity at the same angle has a maximum. Thus, by selecting the sequence of the layers in the MIR (602), it is possible to control the angular emission spectrum of the light-emitting device (600). In the embodiment of FIG. 7, the wavelength corresponding to the maximum reflectivity from the MIR, decreases as a function of the tilt angle ϑ. In another embodiment of the present invention, the wavelength corresponding to the maximum reflectivity from the MIR, increases as a function of the tilt angle ϑ.

It should be noted that the wavelength at which luminescence reaches maximum intensity does not fit of the maximum reflectivity of the MIR at normal incidence. As opposite, the overlap of the maximum reflectivity and the luminescence spectrum occurs at some angle with respect to the direction normal to the exit surface. This angle is preferably larger than 20 degrees in the air. If the light coming out from the light-emitting device propagates in a semiconductor medium, the angle is preferably larger than 5 degrees.

Light-emitting device (600) may operate as a light-emitting diode, preferably as a superluminescent light-emitting diode. In another embodiment of the present invention, light-emitting device (600) may operate as a semiconductor diode laser, but not as a wavelength-stabilized laser.

Luminescence of the active region of the light-emitting device (600) is provided via the current injection into the active region. In another embodiment of the present invention, luminescence is provided by photoexcitation of the active region.

Figure 8:
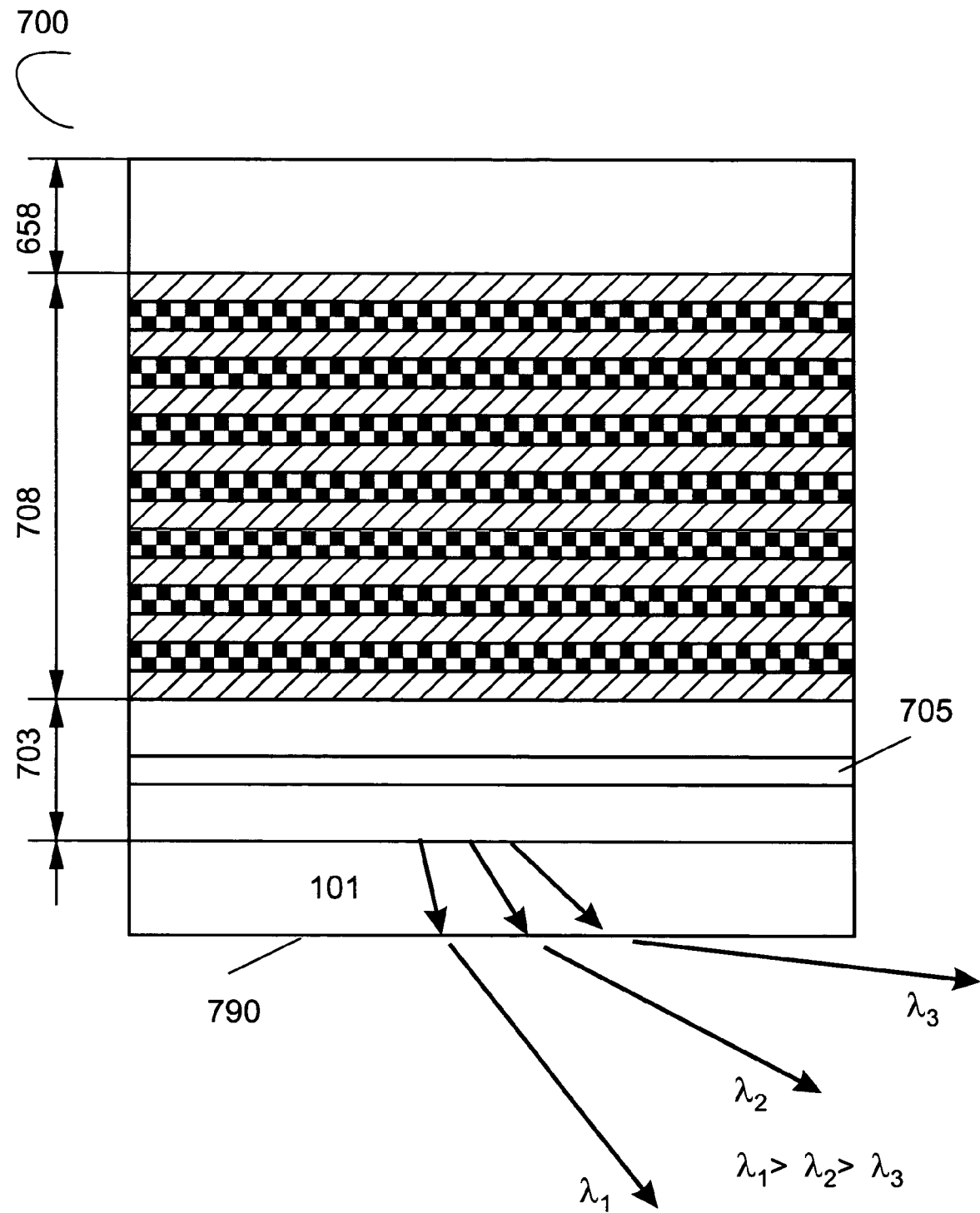
FIG. 8 shows a schematic diagram of a light-emitting device emitting light in a broad spectrum of the wavelengths and in a broad interval of angles deflected from the direction normal to the bottom surface of the substrate, according to one another embodiment of the present invention.

FIG. 8 illustrates a light-emitting device according to another embodiment of the present invention. The device (700) comprises the substrate (101), the active element (703), the top MIR (708), and the top cladding layer (658). The p-n junction element (705) is preferably placed in the active element (703), Light is generated in the active element (703) at different wavelengths within the luminescence spectrum of the active region. The bottom surface of the substrate (790) is an exit surface. At each particular angle of propagation, the MIR (708) has a certain reflectivity spectrum. This MIR reflectivity spectrum changes as a function of the angle. Light impinging on the MIR (708) undergoes multiple reflection at the interfaces between layers constituting the MIR. Given the tilt angle $\vartheta$ the reflectivity spectrum of the MIR (708) for light impinging on the MIR at this angle, has a maximum at a certain wavelength. Reflected light comes to the substrate (101) and is further emitted from the back side of the substrate. The back side of the substrate is the exit surface of the light-emitting device (700). Thus, for a given tilt angle, the intensity of emitted light has a maximum at the same wavelength, at which the reflectivity spectrum of the MIR (708) has a maximum. Thus, by selecting the sequence of the layers in the MIR (708), it is possible to control the angular emission spectrum of the light-emitting device (700). In the embodiment of FIG. 8, the wavelength corresponding to the maximum reflectivity from the MIR, decreases as a function of the tilt angle $\vartheta$. In another embodiment of the present invention, the wavelength corresponding to the maximum reflectivity from the MIR, increases as a function of the tilt angle $\vartheta$..

Figure 9:
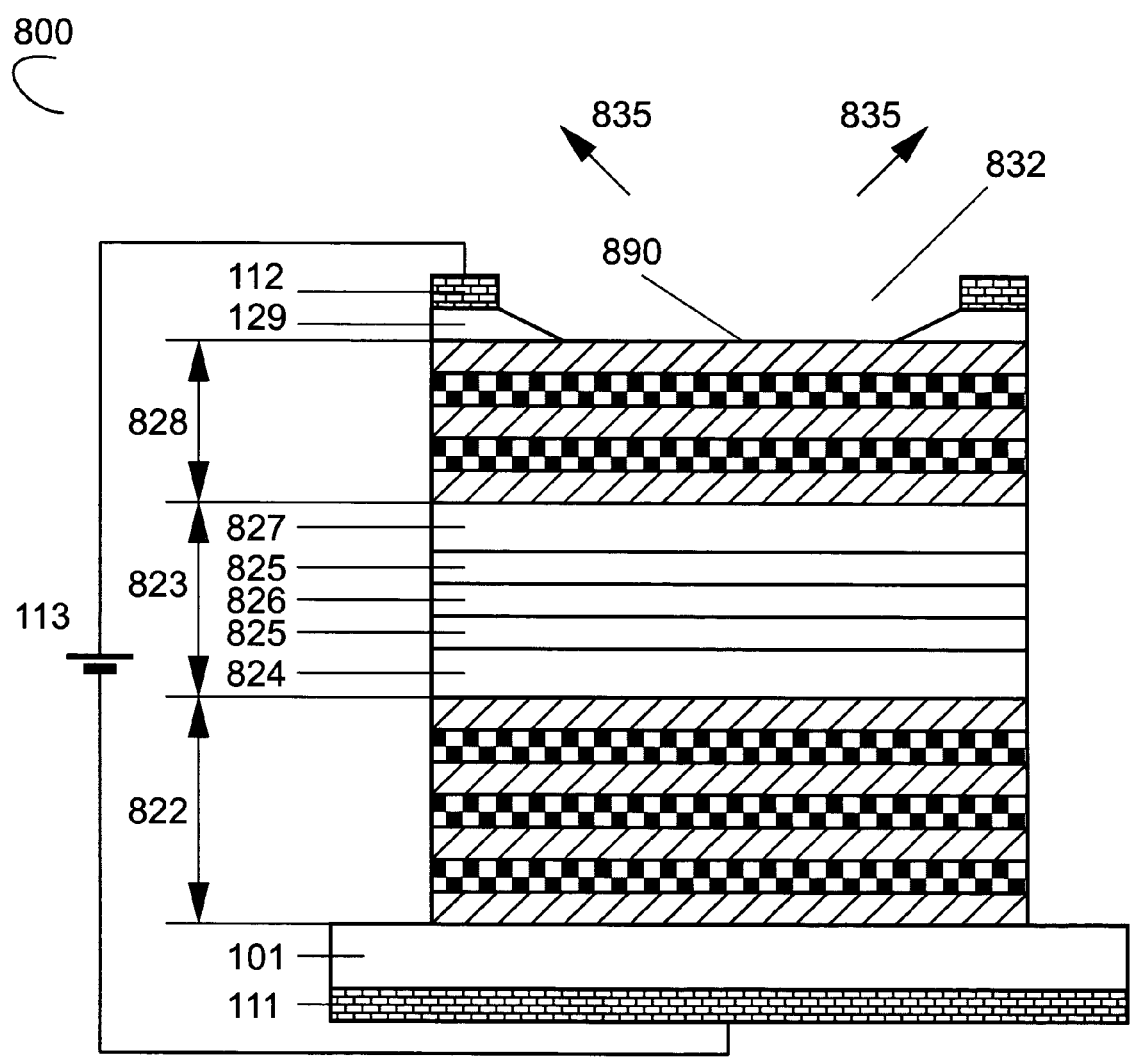
FIG. 9 shows a schematic diagram of a light-emitting device emitting light in a broad spectrum of the wavelengths and in a broad interval of angles deflected from the direction normal to the top surface of the device, wherein light is emitted through an optical aperture on the top surface of the device, according to one another embodiment of the present invention.

FIG. 9 illustrates a light-emitting device (800) according to one another embodiment of the present invention. The device (800) comprises an n-doped bottom MIR (822) grown on the substrate (101), an active element (823), a p-doped top MIR (828), and a top p-contact layer (129). The bottom MIR is preferably n-doped. The active element (823) includes an n-doped layer (824), a confinement layer (825), and a p-doped layer (827). The p-n junction element (826) is placed within the confinement layer (825). The p-n junction element (826) emits light, when a forward bias (113) is applied via the bottom contact (111) and the top contact (112).

The top surface (890) of the device is an exit surface. The optical aperture (832) on the top surface (890) is considerably larger than the wavelength of the emitted light, preferably by the factor of five or more. Then the diffraction of light at the aperture is not very strong, and the far field diagram of the light emission is determined, mainly by the angular properties of the active element (823), the bottom MIR (822), and the top MIR (828). If the aperture (832) has a round shape in the lateral plane, the far field diagram of the light emission will be axially symmetric. At each wavelength within the luminescence spectrum, the maximum intensity will be reached at a certain polar angle $\vartheta$ and will be independent of the azimuth $\phi$, the far field diagram thus having a conical shape. If the aperture (832) has a less symmetric shape, the far field will be less symmetric as well, containing, for typical embodiments, two or four lobes.

Figure 10:
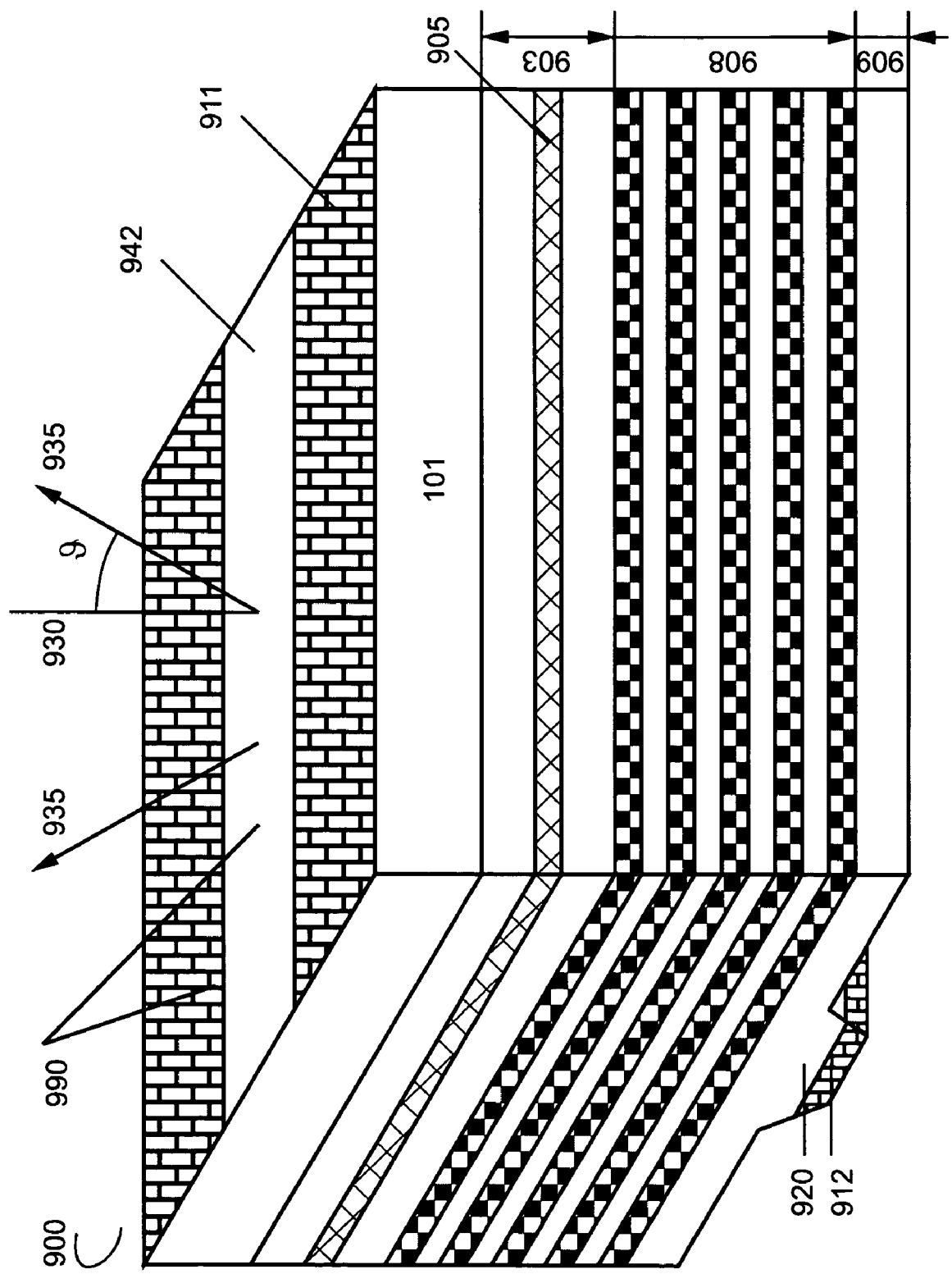
FIG. 10 shows a schematic diagram of a light-emitting device emitting light in a broad spectrum of the wavelengths and in a broad interval of angles deflected from the direction normal to the bottom surface of the substrate, wherein light is emitted through a window in a bottom contact, according to yet another embodiment of the present invention.

FIG. 10 shows a projective view of a light-emitting device (900) according to yet one another embodiment of the present invention. The device grown epitaxially on a substrate (101) contains an active element (903), a top MIR (908), and a top contact layer (909). The ridge (920) is formed on top of the contact layer (909), and the top contact (912) is formed on top of the ridge (920). The bottom contact (911) is mounted on the bottom side of the substrate (101) such, that it covers the bottom substrate surface only partially, and an uncovered window (942) remains. The bottom surface of the substrate is an exit surface (990). Light comes out (935) through the window (942) on the bottom substrate surface (990), at a part of the bottom surface where the contact (911) is not mounted. At each wavelength, the maximum intensity of emitted light is a function of the angle $\vartheta$ between the direction of the propagation of the emitted light and the direction (930) normal to the bottom substrate surface.

The above described embodiments refer to surface-emitting devices, which emit light at some angle with respect to the direction normal to the surface plane. The intensity of the emitted light at each given angle is a function of the wavelength and reaches its maximum at the wavelength, at which the reflectivity of a MIR has its maximum. This feature of a surface-emitting device is employed in the system with an external mirror in the following embodiments of the present invention.

Figure 11:
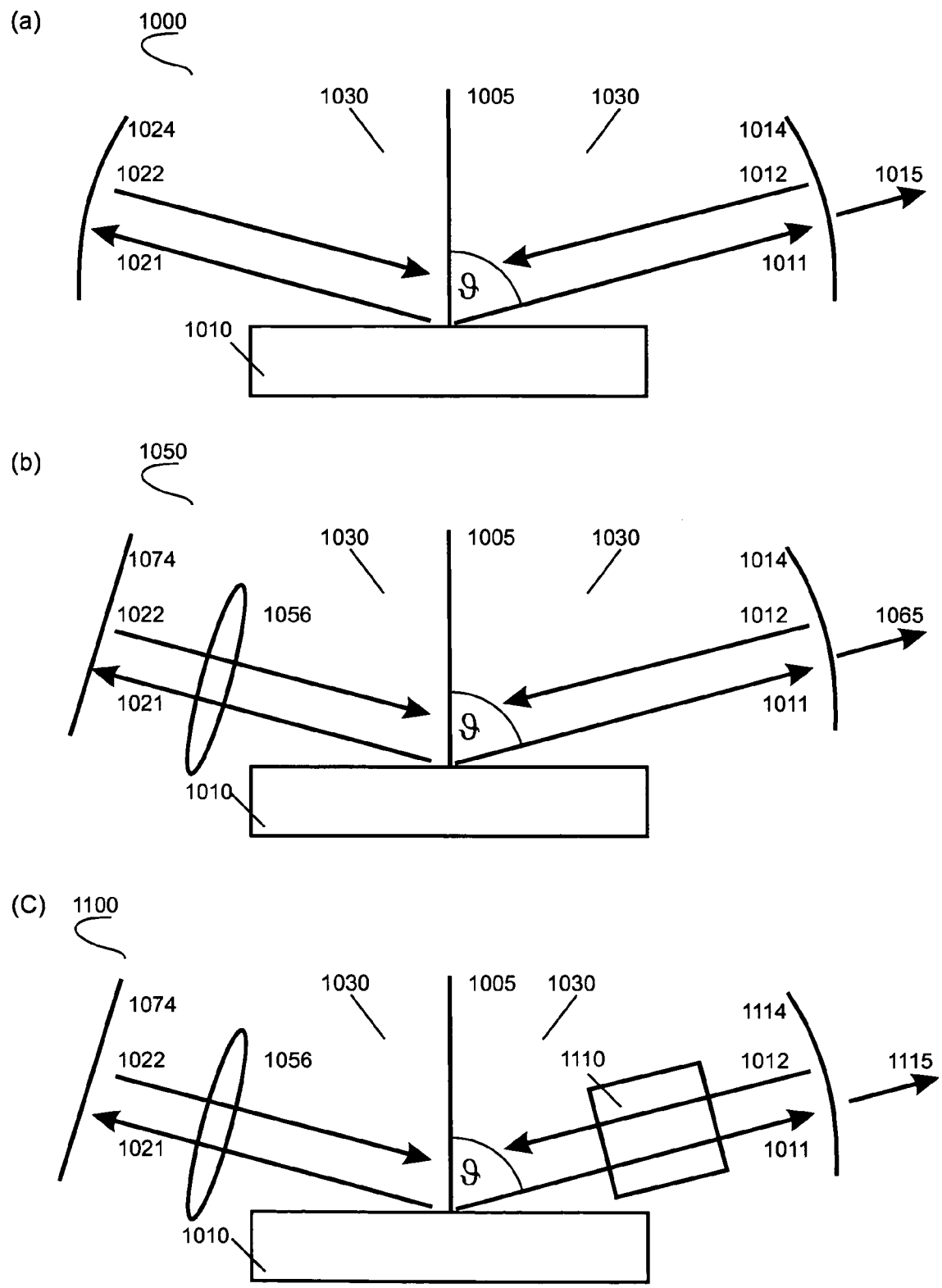
FIG. 11(a) shows an apparatus, according to a first embodiment of the present invention, wherein the apparatus comprises a light-emitting device emitting light without wavelength stabilization, an external cavity, and two external mirrors such that the apparatus generates light at a wavelength, at which phase matching criteria are met, and the apparatus thus providing wavelength stabilized laser radiation.
FIG. 11(b) shows an apparatus, according to a second embodiment of the present invention, wherein the apparatus comprises a light-emitting device emitting light without wavelength stabilization, an external cavity, and two external mirrors such that the apparatus generates light at a wavelength, at which phase matching criteria are met, and the apparatus thus providing wavelength stabilized laser radiation.
FIG. 11(c) shows a schematic diagram of an apparatus for the frequency conversion according to a third embodiment of the present invention; wherein the intracavity frequency conversion is employed.

FIG. 11(*a*) shows an apparatus (1000), according to a first embodiment of the present invention, the apparatus comprising a light-emitting device (1010), an external cavity (1030), and one or a plurality of external mirrors. Since the light-emitting device emits light at some angle $\vartheta$ with respect to the direction (1005) normal to the surface plane, the far-field diagram is typically multi-lobe. Correspondingly, more than one external mirror is used. A preferred embodiment includes a light-emitting device emitting light in two lobes, an external cavity, and two external mirrors, a first mirror (1014) and a second mirror (1024). In this embodiment distance between the exit surface of the light-emitting device (1010) and the mirrors is large, and the major part of the cavity (1030) is a far-field zone of the light-emitting device (1010), where propagation of light obeys the laws of the geometrical optics. Light emitted at angles such that it does not impinge on the mirrors, is lost. Only light emitted at a certain angle, impinges on the mirrors and is reflected back to the surface-emitting device. Light (1011) impinges on the first mirror (1014), is partially reflected back (1012) and partially passes through the mirror forming an outgoing light (1015). Light (1021) impinges on the second mirror (1024) and is reflected back (1022). In the preferred embodiment the first mirror (1014) is semi-transparent, and the second mirror (1024) is not transparent. Then the positive feedback occurs only for light propagating at a certain angle, or in a certain, preferably narrow interval of angles. These are the angles for which emitted light (1011) reaches the first mirror (1014), and light (1012) reflected by the first mirror (1014) reaches the light-emitting device (1010); and for which emitted light (1021) reaches the second mirror (1024), and light (1022) reflected by the second mirror (1024) reaches the light emitting device (1010). On top of the selection in angles, the apparatus (1000) provides wavelength selection. Light reflected by any mirror reaches the active region of the light-emitting device with some phase. Phase matching conditions allowing constructive interference of the emitted light and reflected light are met only at certain fixed wavelengths. Depending on the embodiment, one or a few wavelengths, at which phase matching conditions are met, overlap with the luminescence spectrum of the active region of the light-emitting device. In the preferred embodiment, only one wavelength, at which phase matching conditions are met, overlaps with the luminescence spectrum of the active region of the light-emitting device. Then the lasing will occur just at this wavelength. The laser will then operate as a wavelength-selective laser.

In the preferred embodiment both mirrors (1014) and (1024) are collecting mirrors focusing light and directing it onto a mirror and back onto a surface of the surface-emitting device.

FIG. 11(*b*) shows a second embodiment of the present invention, where the apparatus (1050) contains a second mirror (1074) as a flat mirror, and a collecting lens (1056) is used to focus light onto the mirror or onto the surface of the surface-emitting device. Wavelength-stabilized laser light (1065) comes out through a semi-transparent collecting mirror (1014). In another embodiment of the present invention, a semi-transparent mirror is flat, and a collecting lens is located between this mirror and the surface-emitting device. In one another embodiment, both mirrors are flat, and collecting lenses are placed on both sides of the surface-emitting device.

It is important to emphasize a dramatic difference between the wavelength-selective tilted cavity laser of the prior art and the wavelength selective laser of the present invention. In a tilted cavity laser, the wavelength selection is governed by the intersection of the dispersion law of a cavity and of that of a MIR. The dispersion law of the cavity is the dependence of the mode angle of the mode confined in the cavity on the wavelength, and the dispersion law of the MIR is governed by the dependence of the reflectivity maximum on the tilt angle. The minimum of the leakage loss is reached just at this intersection, and the lasing occurs at the wavelength corresponding to the minimum loss.

In the laser with the external mirror of the present invention, the angle is fixed by the direction from the surface-emitting device to the external mirror, and the wavelength of lasing is governed by the phase matching conditions between the emitted light and reflected light allowing constructive interference. As phase matching conditions are met only at certain wavelengths, it is not necessary, that the light emitting device itself is wavelength stabilized. The wavelength stabilization is provided by an external mirror. Actually, the light-emitting device may be wavelength-stabilized, e.g. may be realized as a wavelength-stabilized tilted cavity laser in one of the embodiments of the present invention. In this case, the wavelength stabilization is enhanced by an external mirror.

FIG. 11(c) shows an apparatus for frequency conversion (1100) according to a third embodiment of the present invention. A non-linear crystal is located within the cavity. The apparatus comprising a light-emitting device (1010), an external cavity (1030), a first mirror (1114), and a second non-transparent mirror (1074) generates wavelength-stabilized primary laser light. The optical path of the laser light at the first harmonic goes through a non-linear crystal (1110), where a second harmonic of light is generated. All mirrors are preferably non-transparent for the primary light. One mirror (1114) is preferably semi-transparent for the generated second harmonic of light. Laser light at second harmonic (1115) comes out through the mirror (1114).

It should be noted that the optical path of light is tilted with respect to the surface of the light-emitting device. An advantage of this approach, among others, is that the optical power in the nonlinear crystal is enhanced by the factor $1/\cos\vartheta$, and the efficiency of the frequency conversion is enhanced by the factor $1/\cos^2\vartheta$.

Figure 12:
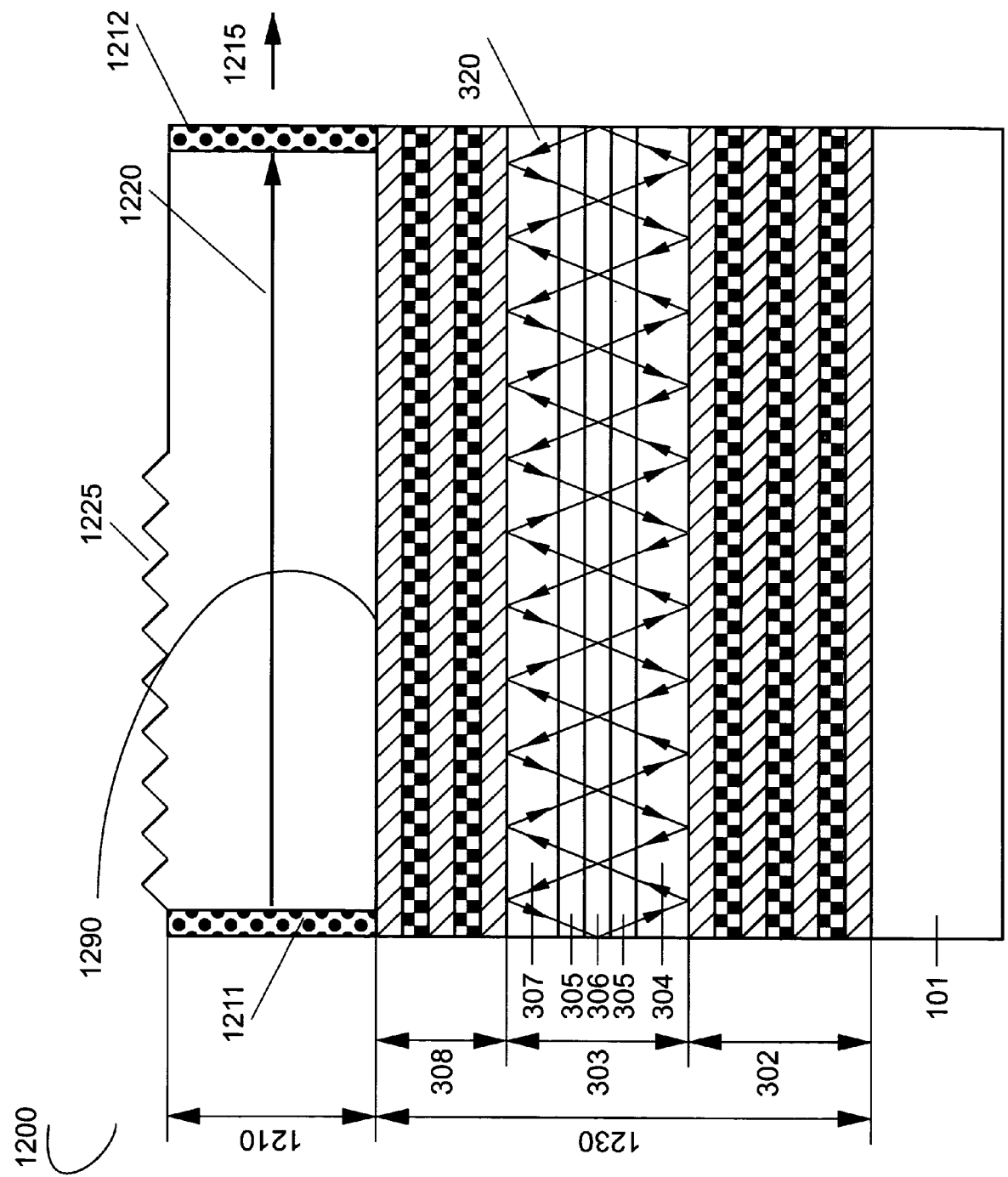
FIG. 12 shows a schematic diagram of an apparatus generating wavelength-stabilized laser light according to a fourth embodiment of the present invention.

FIG. 12 shows a fourth embodiment of the present invention. The apparatus (1200) comprises a light-emitting device (1230) coupled with the second waveguide (1210). Light generated by the device (1230) in one or plurality optical modes (320) comes through the top MIR (308) and the exit surface (1290) and is thus coupled to the second waveguide (1210). The device (1230) in this particular embodiment is shown similar as a tilted cavity laser of FIG. 3. However, the cavity (303), the bottom MIR (302) and the top MIR (308) are not selected to provide wavelength stabilization. In this embodiment, a plurality of optical modes is coupled to the second waveguide (1210). To provide wavelength selectivity, a grating (1225) is formed on the top surface of the second waveguide or on a part of the top surface. The grating (1225) results in the selection of one optical mode (1220) since phase-matching conditions are met only for one or a few selective wavelengths. A high reflection coat (1211) and an antireflection coat (1212) are deposited on the facets of the device, and wavelength-stabilized laser light (1220) comes out (1215) through the antireflection coat (1212).

In another embodiment of the present invention, the apparatus comprises a light-emitting device similar to one of those shown in FIG. 7 and FIG. 8, which does not comprise any high-finesse cavity at all, wherein the device is coupled with the second waveguide, and generated light exits through a side facet.

Figure 13:
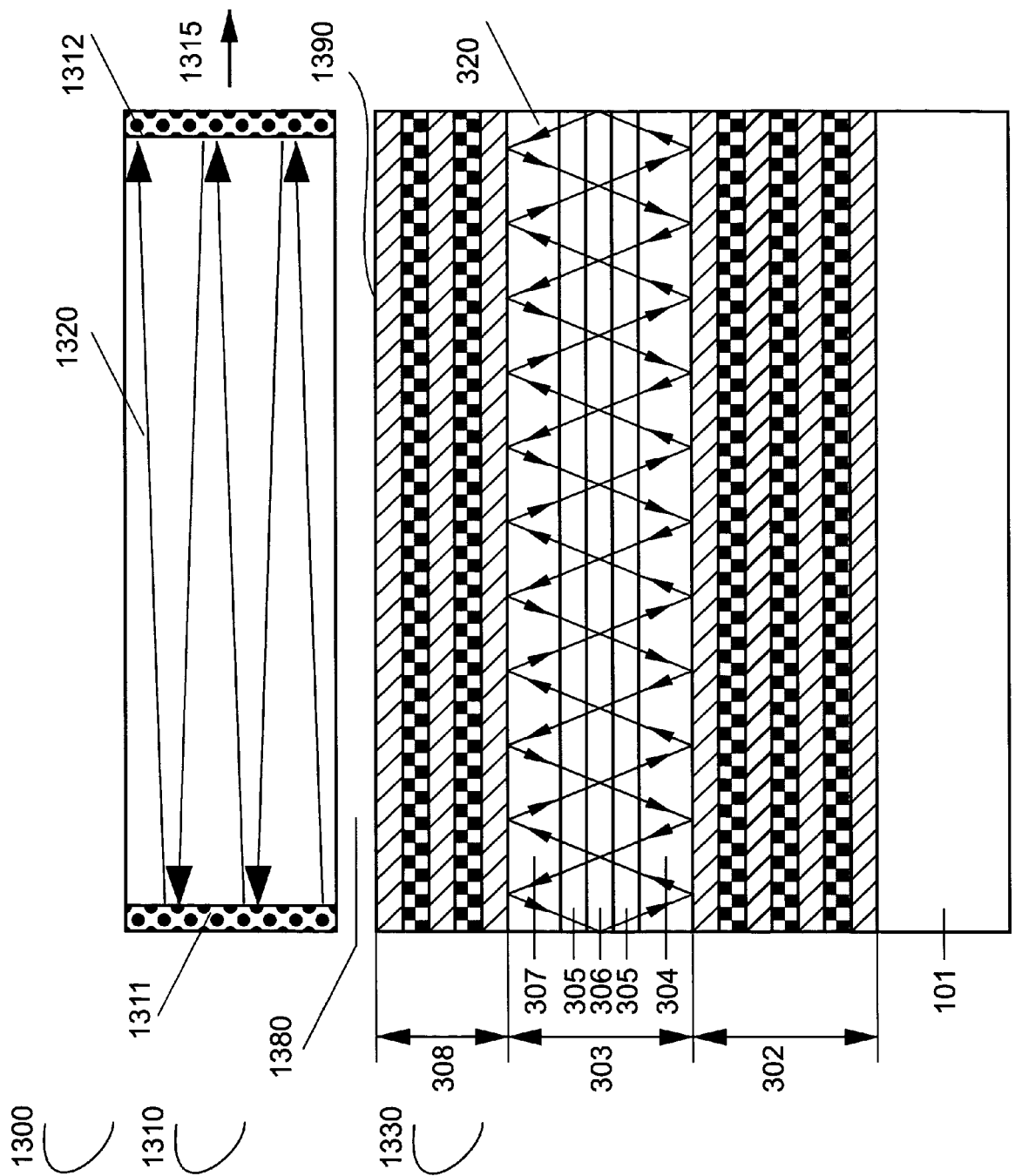
FIG. 13 shows a schematic diagram of an apparatus for the frequency conversion according to a fifth embodiment of the present invention, wherein the primary light is out coupled to the non-linear crystal via near field zone.

FIG. 13 shows an apparatus for frequency conversion according to a fifth embodiment of the present invention. The apparatus (1300) comprises a tilted cavity laser (1330) and a conversion element (1310). The tilted cavity laser (1330) is selected such that it generates laser light at the first harmonic in a closed optical mode. The light in this mode is not emitted from the laser (1330) and is present in the near-field zone in the form of the evanescent electromagnetic field. The laser (1330) is coupled with the conversion element (1310) via the near-field zone (1380). The near field zone (1380) is a zone in the vicinity of the exit surface (1390) of the laser (1330). The conversion element (1310) comprises a non-linear crystal, rear mirror (1311) and front mirror (1312). If the non-linear crystal is placed in the near-field zone of the laser optical field of the first harmonic, light penetrates into the non-linear crystal and may be converted into light of a second harmonic. The top MIR (308) of the laser (1330) is selected such that light at a second harmonic does not propagate through the MIR and is reflected back into the cavity. The rear mirror (1311) is preferably non-transparent for the second harmonic of light, and the front mirror is preferably semi-transparent for the second harmonic of light. Generated light at the second harmonic (1320) comes out (1315) through a semi-transparent front mirror (1312).

Figure 14:
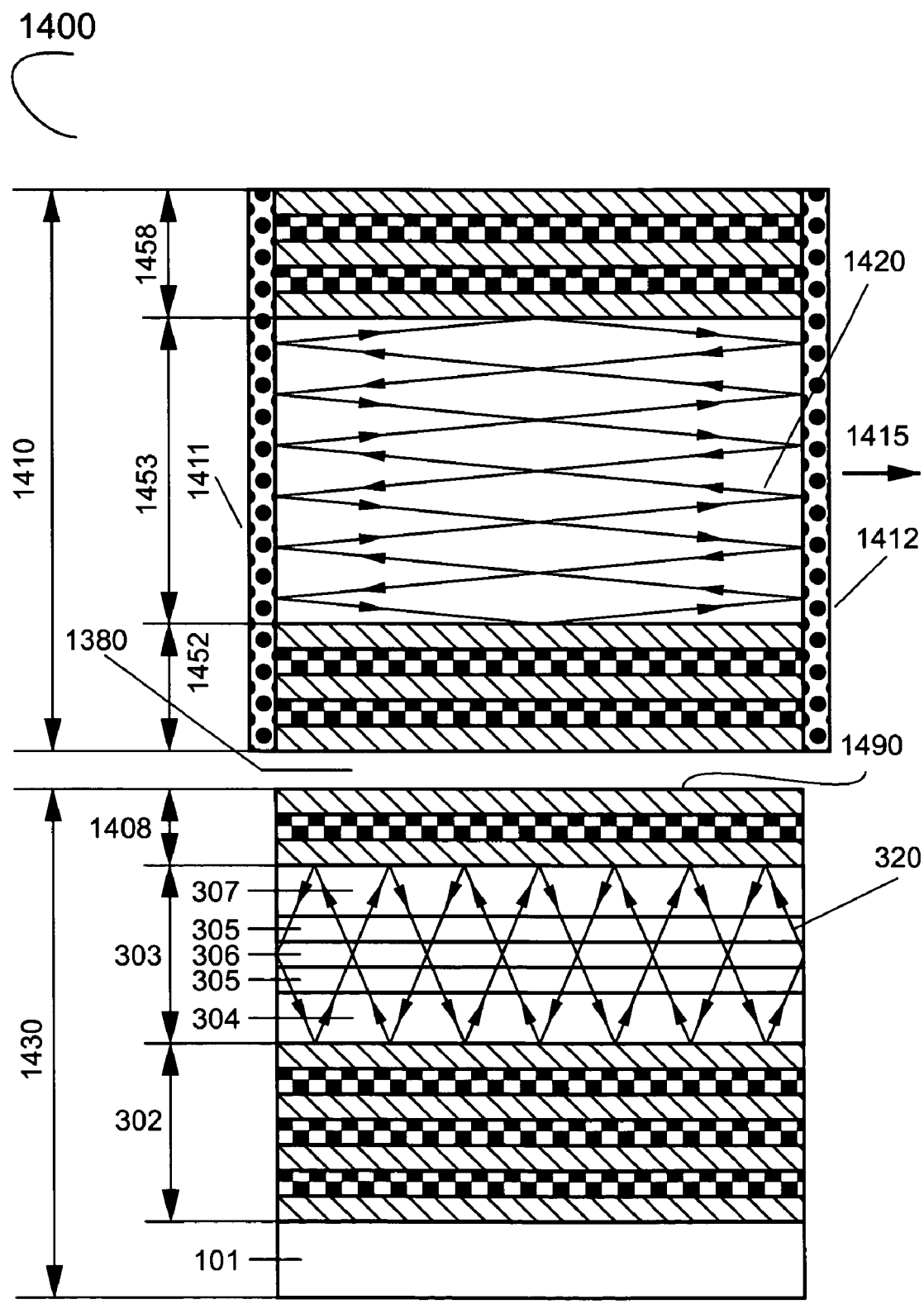
FIG. 14 shows a schematic diagram of an apparatus for generating wavelength-stabilized laser light according to a sixth embodiment of the present invention, wherein the light-emitting device is coupled with the external cavity via near-field zone.

FIG. 14 illustrates an apparatus (1400) for generating wavelength-stabilized laser light according to a sixth embodiment of the present invention. The apparatus comprises a light-emitting device (1430), and a second cavity (1410), whereas the light-emitting device (1430) and the second cavity (1410) are coupled via the near-field zone (1380). The light-emitting device (1430) preferably comprises an n-doped substrate (101), and n-doped bottom multilayer interference reflector (MIR), or a first MIR (302), a cavity (303), and a p-doped top MIR, or second MIR (1408). Contrary to a tilted cavity laser of the prior art shown in of FIG. 3, the device (1430) generates light, which is not wavelength-stabilized. The top MIR (1408) is not very thick and a finesse of the cavity (303) is medium such that generated laser light is present outside the second MIR (1408) in the near-field zone (1380). To evaluate the finesse $Q_1$, one can consider the reflection spectrum of the laser (1430) at a tilted angle of incidence $\vartheta$, and define the finesse as $$Q_1 = \frac{\lambda}{\Delta\lambda}. \tag{11}$$

Here $\lambda$ is the wavelength of the reflectivity dip, and $\Delta\lambda$ is the width of the dip. In a preferred embodiment the finesse is preferably in the interval between 10 and 1000.

The second cavity (1410) is an external cavity comprising preferably a third multilayer interference reflector (1452), a central part (1453), and a fourth MIR (1458). Light generated in a tilted optical mode (320) of the first cavity (303) leaks through the second MIR (1408) from the light-emitting device (1430) through an exit surface (1490) and is, via the near field zone (1380) coupled with the one of the optical modes (1420) of the second cavity (1410). The finesse of the second cavity $Q_2$ is preferably higher than the finesse of the first cavity $Q_1$, $$Q_2 > Q_1. \tag{12}$$

The near-field zone (1380), the third MIR (1452), and the central part (1453) of the second cavity form effectively an external cavity for the light-emitting device (1430). The fourth MIR (1458) serves as an external mirror.

Then the phase matching conditions for the light in the entire apparatus (1400) are met, and a positive feedback occurs only for one or a few wavelengths within a luminescence spectrum of the light-emitting device (1410). The second cavity may be optionally covered by a highly reflecting coat (1411) and an antireflecting coat (1412). Then the apparatus will generate wavelength-stabilized laser radiation coming out (1415) through the antireflecting coat (1412).

The following note should be given. In the embodiment of FIG. 14, the light-emitting device (1430) alone can operate only as a light-emitting diode, as a high optical loss due to the leakage of light through the second MIR (1408) does not allow reaching the lasing threshold. Another embodiment is possible, where the light-emitting device (1430) alone can operate as a laser, which is not wavelength-stabilized.

Figure 15:
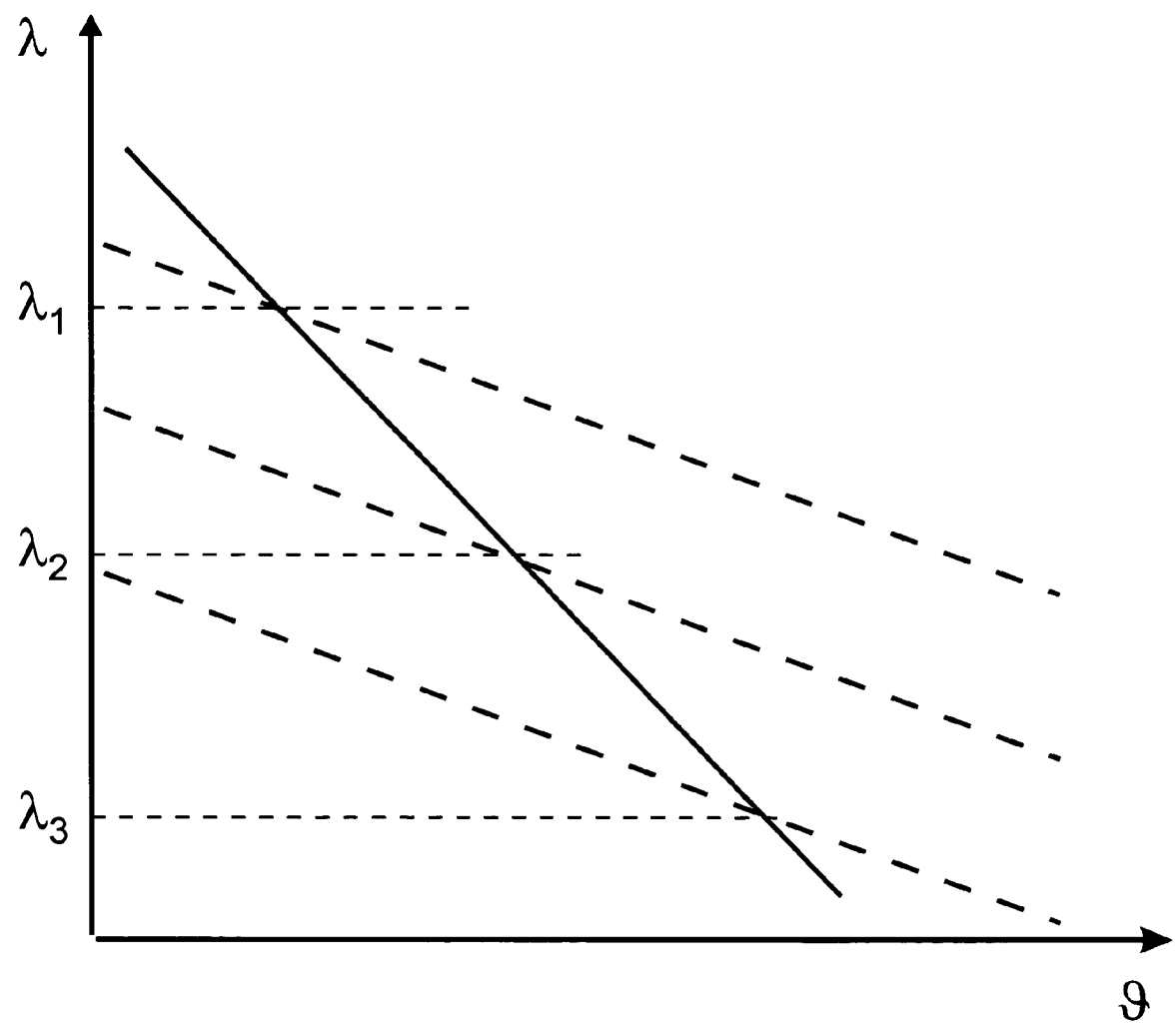
FIG. 15 shows schematically the dispersion law curves corresponding to the tilted optical modes of two coupled cavities illustrating wavelength-stabilized operation of the apparatuses of the present invention.

FIG. 15 illustrates the principle of the wavelength selection. The wavelength of the optical mode confined in the first cavity, as a function of the mode angle ϑ, is described by a solid curve in FIG. 15. The wavelength of the optical modes confined in the second cavity, as a function of the mode angle ϑ, is given by dashed curves. The phase matching condition for the apparatus (1400) is met at an intersection point of the two curves. In the preferred embodiment illustrated in FIG. 14, the thickness of the second cavity (1453) is larger than the thickness of the first cavity (303). Therefore, the spacing between the optical modes of the second cavity in FIG. 15 is smaller than the spacing between the modes of the first cavity. The apparatus (1400) generates laser light at one or a few selected wavelengths, at which phase matching conditions are met, and a constructive interference and, hence a positive feedback occurs. Namely, these are wavelengths $\lambda_1$, $\lambda_2$, and $\lambda_3$ in FIG. 15. If only one selected wavelength overlaps with the luminescence spectrum of the light-emitting device (1430), the apparatus (1400) will generate wavelength-stabilized laser light.

Figure 16:
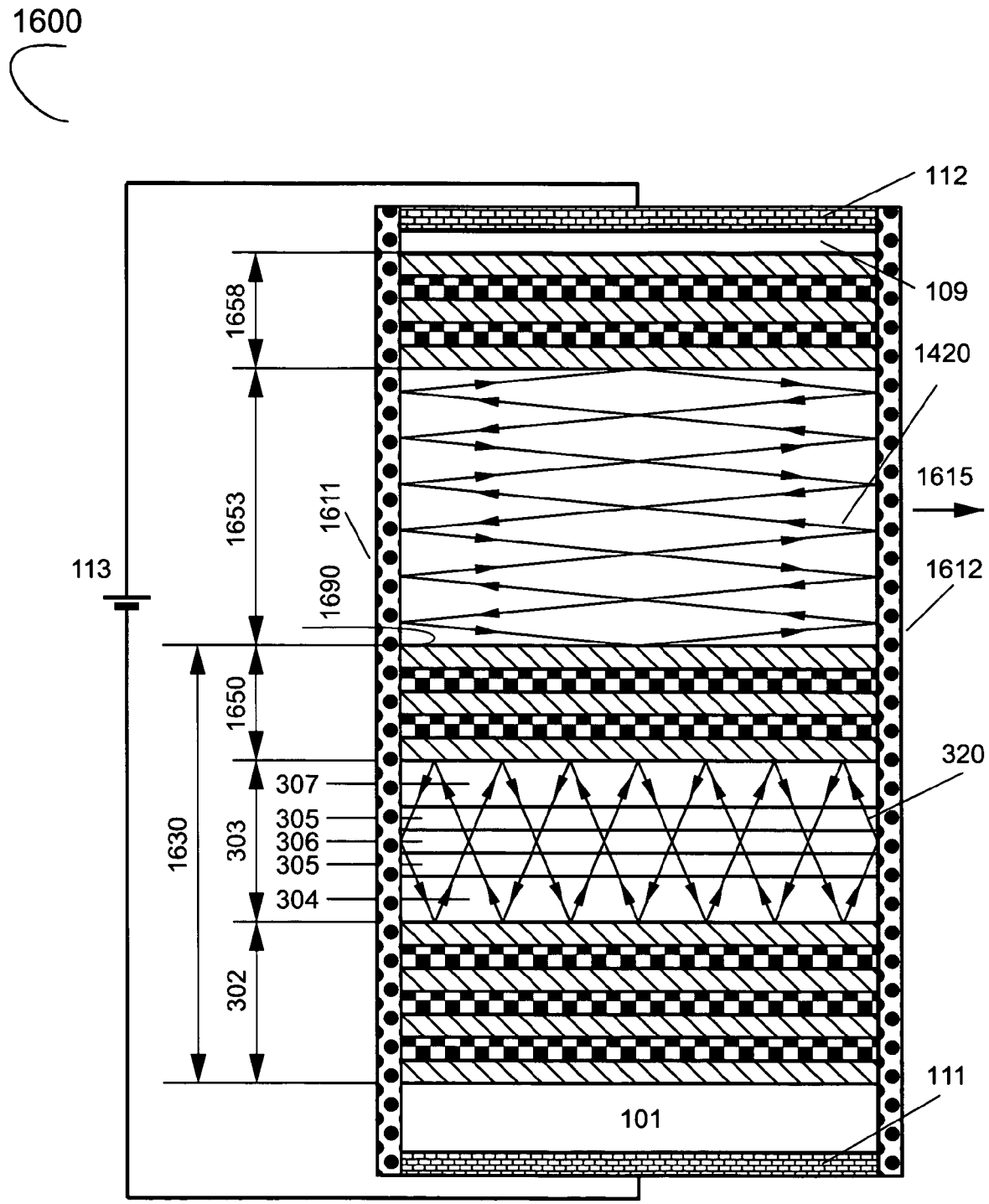
FIG. 16 shows a schematic illustration of an apparatus for generating wavelength-stabilized light according to a seventh embodiment of the present invention, wherein a light-emitting device, an external cavity and an external mirror are grown epitaxially as a single epitaxial structure.

FIG. 16 illustrates an apparatus (1600) for generating wavelength-stabilized laser light according to a seventh embodiment of the present invention. The apparatus is grown epitaxially on the substrate (101) and comprises a light-emitting device (1630), an external cavity (1653) and an external mirror (1658). The light-emitting device (1630) is coupled with the external cavity (1653) epitaxially. The light-emitting device (1630) generates light in a plurality of tilted optical modes (320). These optical modes are coupled with the external cavity (1653) via a second multilayer interference reflector (MIR) (1650). The interface between the second MIR (1650) and the external cavity (1653) plays a role of an exit surface (1690) of the light-emitting device (1630). The external cavity (1653) is bounded by the second MIR (1653) and by the third MIR (1658). Light generated by the light-emitting device (1630) in a plurality of tilted optical modes (320) leaks through the second MIR (1650) into the external cavity (1653). According to FIG. 15, phase-matching conditions for light are met, and a positive feedback occurs at one or a few selective wavelengths, at which the dispersion law of tilted optical modes of the first cavity (303) intersects with the dispersion law of some of the tilted optical modes (1420) of the external cavity (1653), which can also be regarded as a second cavity of the apparatus (1600). The rear facet of the apparatus (1600) is preferably covered by a highly reflecting coat (1611), and the front facet of the apparatus (1600) is preferably covered by an antireflecting coat (1612). Wavelength-stabilized laser light generated at one or a few selected wavelengths comes out (1615) through the antireflecting coat (1612) mounted on the front facet.

It should be noted that the principles of the wavelength-stabilized operation of the laser of the present invention, e.g., of the apparatus (1600) is completely different from the principles of the operation of a tilted cavity laser disclosed earlier in the U.S. Pat. No. 7,031,360 entitled "Tilted cavity semiconductor laser (TCSL) and method of making same", in the patent application Ser. No. 10/943,044 entitled "Tilted cavity semiconductor optoelectronic device and method of making same" and in the patent application Ser. No. 11/194,181 entitled "Tilted cavity semiconductor device and method of making same", all invented by the inventors of the present invention. The tilted cavity laser comprises a high-finesse cavity and a multilayer interference reflector (MIR), selected such that the dispersion law of a tilted cavity mode and the dispersion law of the MIR stopband reflectivity maximum intersect at one and only one selective wavelength and one selective angle. The leakage loss of the optical mode confined in the cavity has a minimum at this selective wavelength.

On the contrary, in the apparatus (1600) as well as in the other all-epitaxial embodiments of the present invention considered below, no wavelength-selective leakage loss is needed. The device may have no loss at all or have non-selective loss. Constructive and destructive interference in a multilayer structure is responsible for wavelength stabilization. Constructive interference realizes a positive feedback needed for lasing. In particular, in the embodiment of FIG. 16, the conditions of the constructive interference are met for one or a few selective wavelengths, wherein the dispersion law curve of the tilted optical mode confined in the first cavity (303) intersect with the dispersion law curve of one of the tilted optical modes confined in the second cavity (1653), as illustrated in FIG. 15.

Figure 17:
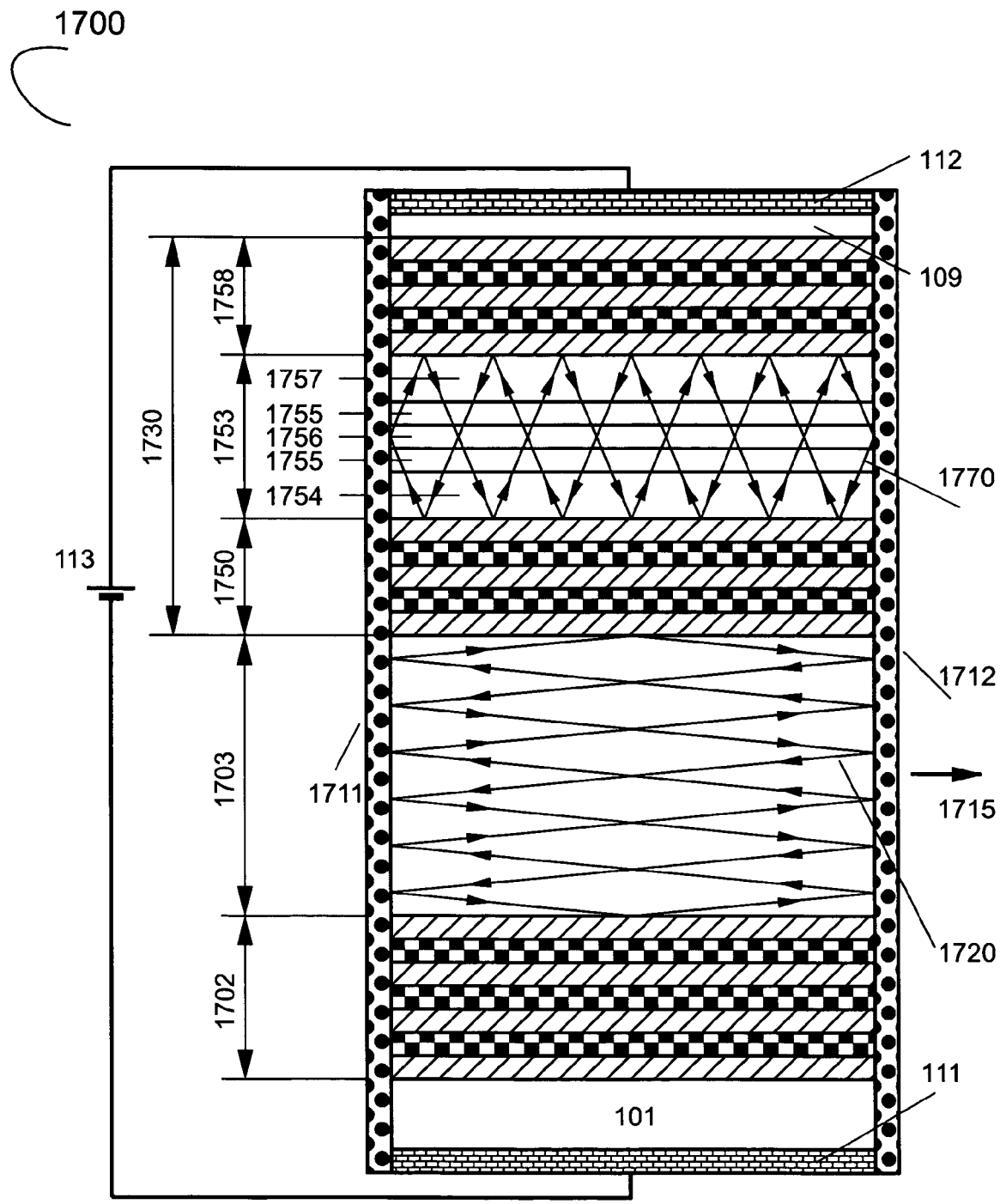
FIG. 17 shows a schematic illustration of an apparatus for generating wavelength-stabilized light according to an eighth embodiment of the present invention.

FIG. 17 illustrates schematically an apparatus (1700) for generating a wavelength-stabilized laser light according to an eighth embodiment of the present invention. The apparatus (1700) is grown epitaxially on the substrate (101) and comprises a light-emitting device (1730), an external cavity (1703) and an external mirror (1702). The light-emitting device (1730) is coupled with the external cavity (1703) epitaxially. The light-emitting device (1730) generates light in a plurality of tilted optical modes (1770). The cavity (1753) is sandwiched between the first multilayer interference reflector (MIR) (1758) and the second MIR (1750). The optical modes (1770) are coupled with the external cavity (1703) via the second MIR (1750). The external cavity (1703) is bounded by the second MIR (1750) and by the third MIR (1702). Light generated by the light-emitting device (1730) in a plurality of tilted optical modes (1770) leaks through the second MIR (1750) into the external cavity (1703). According to FIG. 15, phase-matching conditions for light are met, and a positive feedback occurs at one or a few selective wavelengths, at which the dispersion law of tilted optical modes of the first cavity (1753) intersects with the dispersion law of some of the tilted optical modes (1720) of the external cavity (1703), which can also be regarded as a second cavity of the apparatus (1700). The rear facet of the apparatus (1700) is preferably covered by a highly reflecting coat (1711), and the front facet of the apparatus (1700) is preferably covered by an antireflecting coat (1712). Wavelength-stabilized laser light generated at one or a few selected wavelengths comes out (1715) through the antireflecting coat (1712) mounted on the front facet. The difference between the apparatuses (1700) and (1600) is that in the apparatus (1700) the external cavity (1703) is located on the substrate side of the light-emitting device (1730), and the external mirror (1702) is located between the external cavity (1703) and the substrate (101).

The apparatus (1700) shown in FIG. 17 is grown epitaxially preferably on an n-doped substrate (101). The third MIR (1702), the second cavity (1703), and the second MIR (1750) are preferably n-doped. The first MIR (1758) is preferably p-doped. The cavity (1753) includes an n-doped layer (1754), a confinement layer (1755), and a p-doped layer (1757). The confinement layer (1755) further includes an active region (1756).

The layers forming the third multilayered interference reflector (1702), the second cavity (1703), and the second multilayer interference reflector (1750) are formed preferably from materials lattice-matched or nearly lattice matched to the substrate (101), are transparent to the generated light, are doped by a donor impurity and have alternating high and low refractive indices. For an apparatus grown on a GaAs substrate, alternating layers of GaAs and GaAlAs or layers of GaAlAs having alternating aluminum content preferably form the third (1702) and the second (1750) MIRs.

The n-doped layer (1754) of the cavity (1753) is formed preferably from a material lattice-matched or nearly lattice-matched to the substrate (101), is transparent to the generated light, and is doped by a donor impurity.

The p-doped layer (1757) of the cavity (1753) is formed preferably from a material lattice-matched or nearly lattice-matched to the substrate (101), is transparent to the generated light, and is doped by an acceptor impurity.

The layers forming the top multilayered interference reflector (the first MIR) (1758) are formed preferably from materials lattice-matched or nearly lattice-matched to the substrate (101), are transparent to the generated light, are doped by an acceptor impurity, and have alternating high and low refractive indices. For an apparatus grown on a GaAs substrate, alternating layers of GaAs and GaAlAs or layers of GaAlAs having alternating aluminum content form the MIR.

The confinement layer (1755) is formed preferably from a material lattice-matched or nearly lattice-matched to the substrate (101), is transparent to the generated light, and is either undoped or weakly doped.

The active region (1756) placed within the confinement layer (1755) is preferably formed by any insertion, the energy band gap of which is narrower than that of the layers constituting the first MIR (1758), the p-doped layer (1757) of the cavity (1753), the confinement layer (1755) of the cavity (1753), the n-doped layer (1754) of the cavity (1753), the second MIR (1750), the second cavity (1703), and the third MIR (1702). Possible active regions (1756) include, but are not limited to, a single-layer or a multi-layer system of quantum wells, quantum wires, quantum dots, or any combination thereof. In the case of a device on a GaAs-substrate, examples of the active region (1756) include, but are not limited to, a system of insertions of InAs, $In_{1-x}Ga_xAs$, $In_xGa_{1-x-y}Al_yAs$ $In_xGa_{1-x-y}Al_yAs$, $In_xGa_{1-x}As_{1-y}N_y$ or similar materials.

Figure 18:
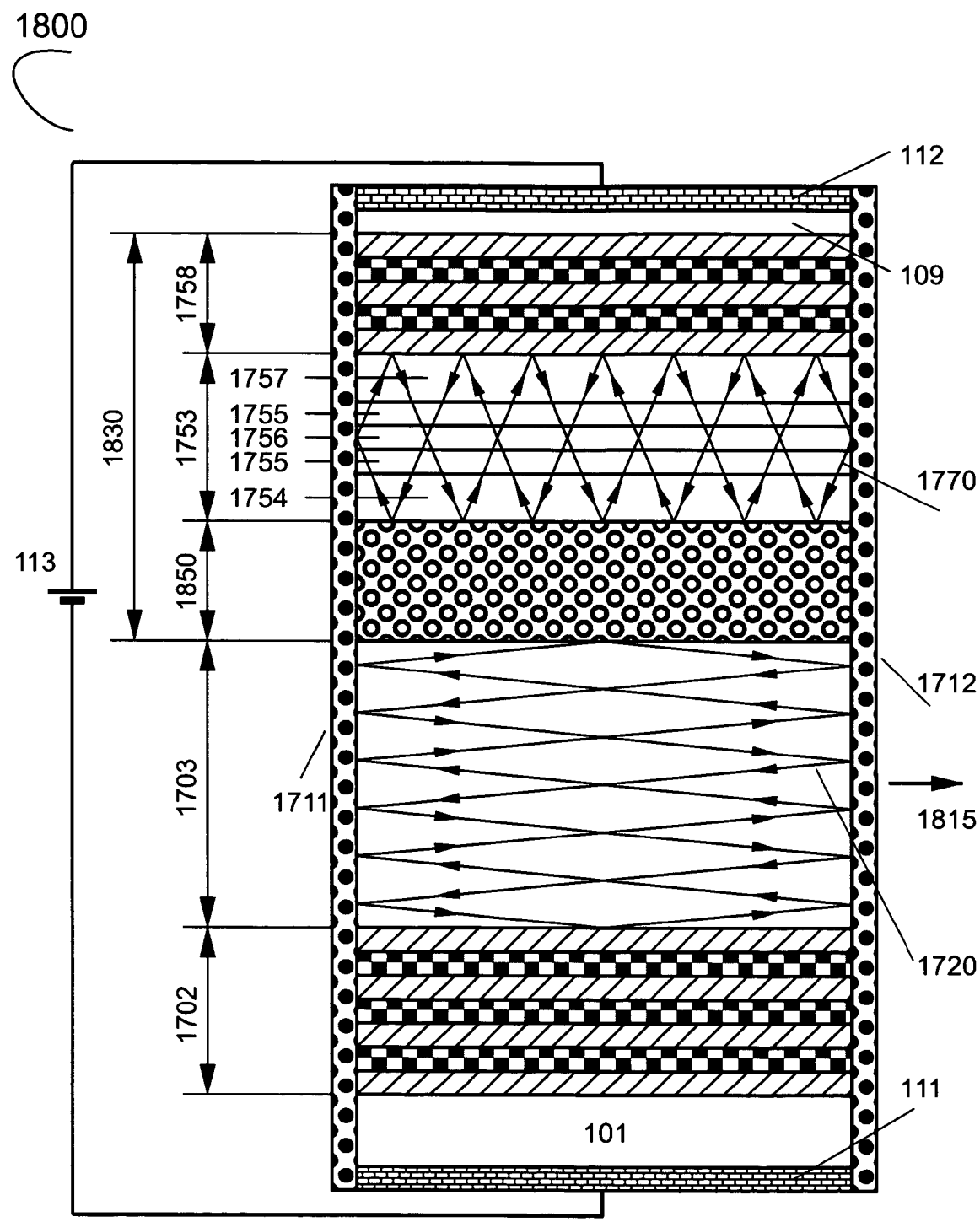
FIG. 18 shows a schematic illustration of an apparatus for generating wavelength-stabilized light according to a ninth embodiment of the present invention.

FIG. 18 illustrates schematically an apparatus (1800) for generating a wavelength-stabilized laser light according to a ninth embodiment of the present invention. The light-emitting device (1830) generates light in a plurality of tilted optical modes (1770), and light leaks to the external cavity (1711) not through a multilayer interference reflector, but through an evanescent reflector (1850). The phase matching conditions are met, and a positive feedback occurs for a single or a few wavelengths, which results in the generation of the wavelength-stabilized laser light which comes out of the apparatus (1815) through a front facet, preferably covered by an antireflecting coat (1712).

Figure 19:
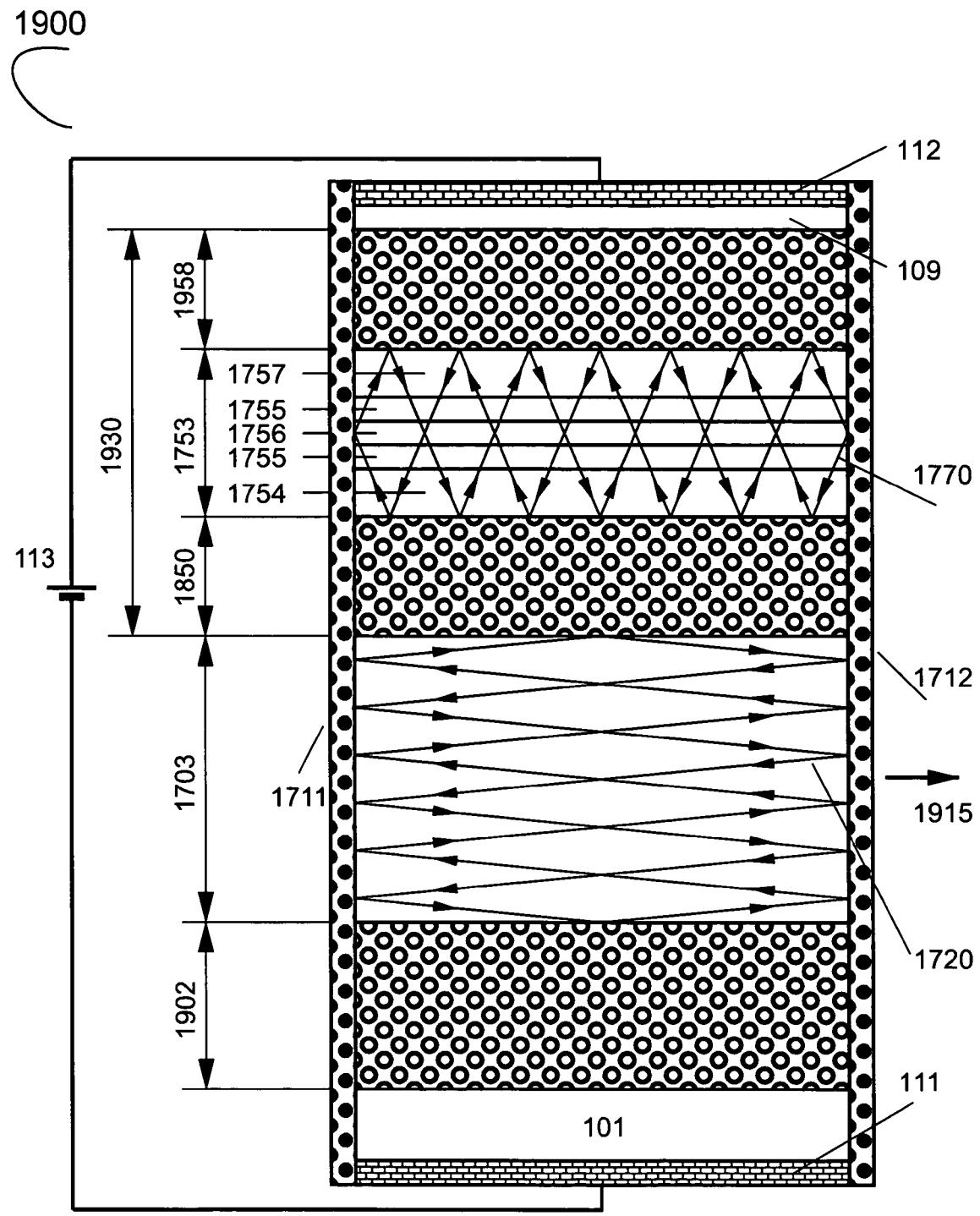
FIG. 19 shows a schematic illustration of an apparatus for generating wavelength-stabilized light according to a tenth embodiment of the present invention.

FIG. 19 illustrates schematically an apparatus (1900) for generating a wavelength-stabilized laser light according to a tenth embodiment of the present invention. The apparatus (1900) is grown epitaxially on the substrate (101) and comprises a light-emitting device (1930), an external cavity (1703), and an external mirror (1902). The light-emitting device (1930) comprises a cavity (1753) sandwiched between a first evanescent reflector (1958) and a second evanescent reflector (1850). Light generated in the light-emitting device (1930) in a plurality of tilted optical modes (1770), leaks through the evanescent reflector (1850) into the external cavity (1703). The cavity (1703) is an external cavity with respect to the light-emitting device (1930). It can also be regarded as a second cavity of the apparatus (1900). The second cavity (1703) is sandwiched between the second evanescent reflector (1850) and a third evanescent reflector (1902). Thus, the evanescent reflector (1902), which is the external reflector with respect to the light-emitting device (1930), is the third reflector of the entire apparatus (1900). According to FIG. 15, phase-matching conditions for light are met, and a positive feedback occurs at one or a few selective wavelengths, at which the dispersion law of tilted optical modes of the first cavity (1753) intersects with the dispersion law of some of the tilted optical modes (1720) of the external cavity (1703). The rear facet of the apparatus (1900) is preferably covered by a highly reflecting coat (1711), and the front facet of the apparatus (1900) is preferably covered by an antireflecting coat (1712). Wavelength-stabilized laser light generated at one or a few selected wavelengths comes out (1915) through the antireflecting coat (1712) mounted on the front facet.

Figure 20:
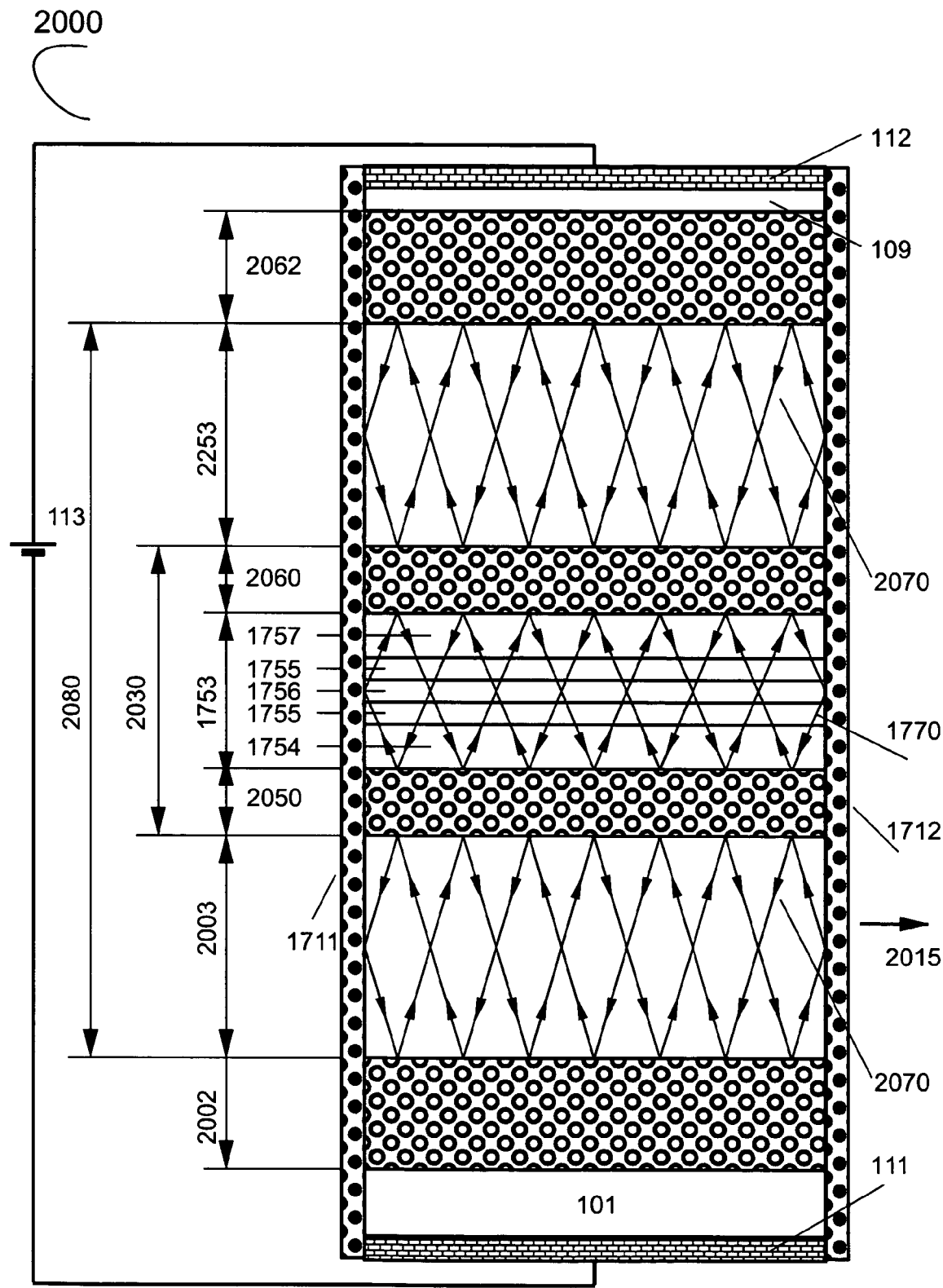
FIG. 20 shows a schematic illustration of an apparatus for generating wavelength-stabilized light according to an eleventh embodiment of the present invention.

FIG. 20 illustrates schematically an apparatus (2000) for generating wavelength-stabilized laser radiation according to an eleventh embodiment of the present invention. The apparatus (2000) is grown epitaxially on a substrate (101) and comprises light-emitting device (2030) inserted in an external cavity (2080). The light-emitting device (2030) comprises a first cavity (1753) sandwiched between a first evanescent reflector (2060) and a second evanescent reflector (2050). The external cavity (2080) comprises a first part (2003) of the external cavity contiguous to the light-emitting device (2030) from the substrate side, the light-emitting device (2030), and a second part (2053) contiguous to the light-emitting device (2030) from the side opposite to the substrate side. The first part (2003) of the external cavity (2080) is bounded by the second evanescent reflector (2050) and an evanescent reflector (2002) which may be regarded as a first external mirror with respect to the light-emitting device (2030). The same evanescent reflector (2002) may also be regarded as a third evanescent reflector of the apparatus (2000). The second part (2053) of the external cavity (2080) is bounded by the first evanescent reflector (2060) and an evanescent reflector (2062) which may be regarded as a second external mirror with respect to the light-emitting device (2030). The same evanescent reflector (2062) may also be regarded as a fourth evanescent reflector of the apparatus (2000). The apparatus (2000) operates as follows. The light-emitting device (2030) generates light in a plurality of tilted optical modes (1770). Light in these optical modes leaks through the first evanescent reflector (2060) into the second part (2053) of the external cavity (2080) and through the second evanescent reflector (2050) into the first part (2003) of the external cavity (2080). As illustrated in FIG. 15, phase matching conditions are met, and a positive feedback occurs at one or a few selected wavelengths, at which the dispersion law curve of the optical modes (1770) of the first cavity (1753) intersects with the dispersion law curve of the optical modes (2070) of the external cavity (2080). Therefore, the apparatus (2000) generates wavelength-stabilized laser light which comes out (2015) through the antireflecting coat mounted on a front facet.

A plurality of embodiments of the present invention are possible, wherein any one, or any two, or any three, or all four of the four reflectors of the apparatus shown in FIG. 20, are not evanescent reflectors, but multilayer interference reflector(s).

Figure 21:
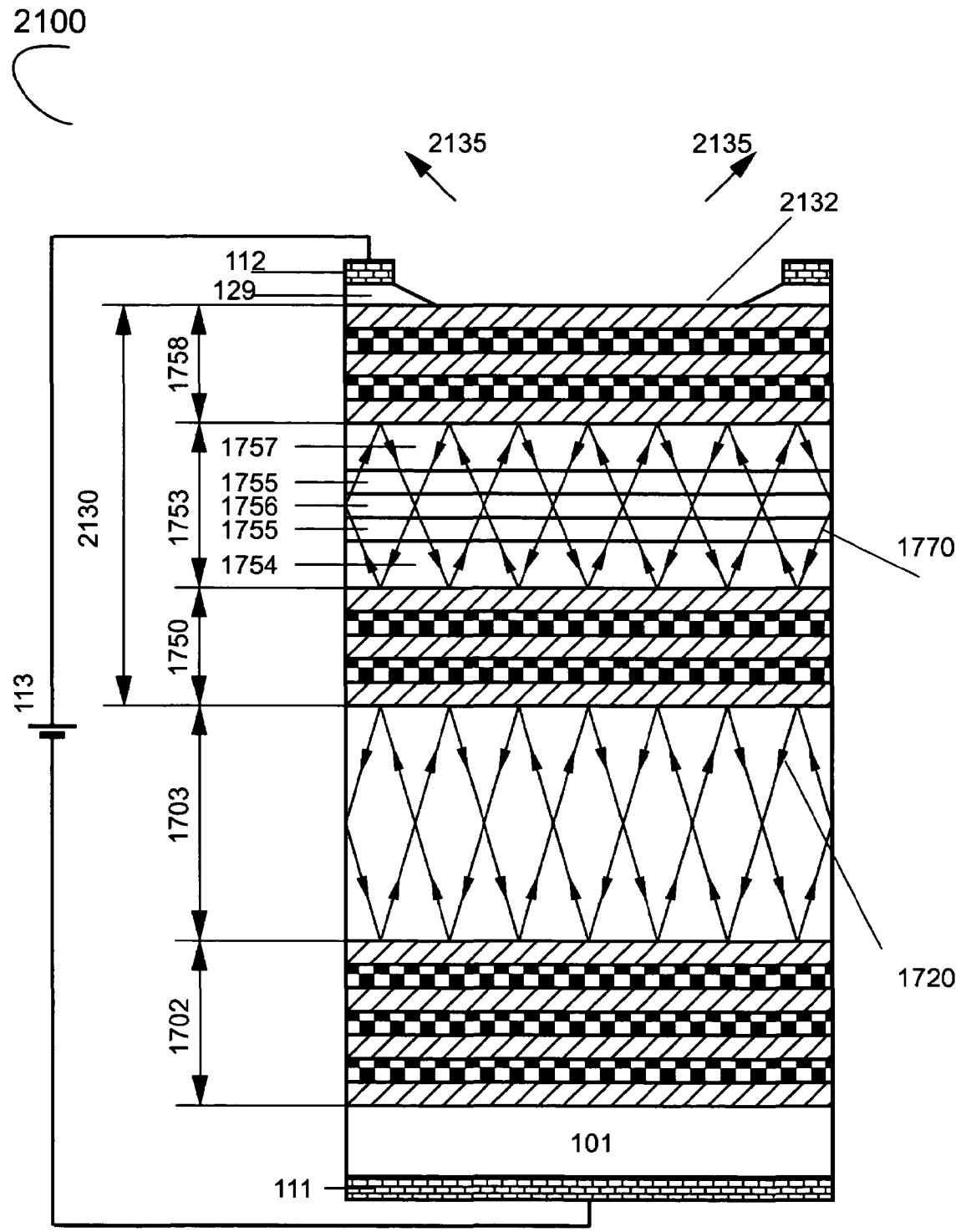
FIG. 21 shows a schematic illustration of an apparatus for generating wavelength-stabilized light according to a twelfth embodiment of the present invention.

FIG. 21 shows an apparatus (2100) generating wavelength-stabilized laser light according to a twelfth embodiment of the present invention. The apparatus is grown epitaxially on a substrate (101) and comprises a light-emitting device (2130), an external cavity (1703), and an external mirror (1702). The light-emitting device (2130) further comprises a first cavity (1753) sandwiched between a first multilayer interference reflector (MIR) (1758) and a second multilayer interference reflector (MIR) (1750). The apparatus (2100) operates as follows. The light-emitting device (2130) generates light in a plurality of tilted optical modes (1770). Light in these modes leaks through the second MIR (1750) to the external cavity (1703). The multilayer interference reflector (1702), which is an external mirror with respect to the light-emitting device (2130), may also be considered as a third MIR of the entire apparatus (2100), and the external cavity (1703) may be regarded as a second cavity of the entire apparatus (2100). The second cavity (1703) is thus bounded by the second MIR (1750) and by the third MIR (1702). According to FIG. 15, phase-matching conditions for light are met, and a positive feedback occurs at one or a few selective wavelengths, at which the dispersion law of tilted optical modes of the first cavity (1753) intersects with the dispersion law of some of the tilted optical modes (1720) of the external cavity (1703), which can also be regarded as a second cavity of the apparatus (1700).

Generated wavelength-stabilized laser light is coming out (2135) through the top surface of the apparatus (2100). The optical aperture (2132) on the top surface is considerably larger than the wavelength of the emitted light, preferably by the factor of five or more. Then the diffraction of light at the aperture is not very strong, and the far field diagram of the light emission is determined, mainly by the tilt angle of the tilted optical mode, for which phase-matching conditions are met. If the aperture (2132) has a round shape in the lateral plane, the far field diagram of the light emission will be axially symmetric. At each wavelength within the luminescence spectrum, the maximum intensity will be reached at a certain polar angle $\vartheta$ and will be independent of the azimuth $\varphi$, the far field diagram thus having a conical shape. If the aperture (2132) has a less symmetric shape, the far field will be less symmetric as well, containing, for typical embodiments, two or four lobes.

In the embodiment of FIG. 21, the bottom contact (n-contact) (111) is mounted on the substrate (101) on the side opposite to the third MIR (1702). The top contact (p-contact) (112) is mounted on top of the p-contact layer (129) which is mounted on top of the first MIR (1758), on the side opposite to the first cavity (1753). In this embodiment, the substrate (101), the third MIR (1702), the second cavity (1703), the second MIR (1750), and the layer (1754) of the first cavity (1753) are n-doped. The layer (1757) of the first cavity (1753), the first MIR (1758), and the p-contact layer (129) are p-doped. Forward bias (113) is applied to the active region (1756) through the bottom contact (111) and the top contact (112).

Different embodiments are possible, wherein one or both contacts are intracavity contacts, and the corresponding part of the structure can be made undoped or weakly doped.

And yet another embodiment of the present invention is possible, where generated wavelength-stabilized laser light comes out of the apparatus through the substrate.

Figure 22:
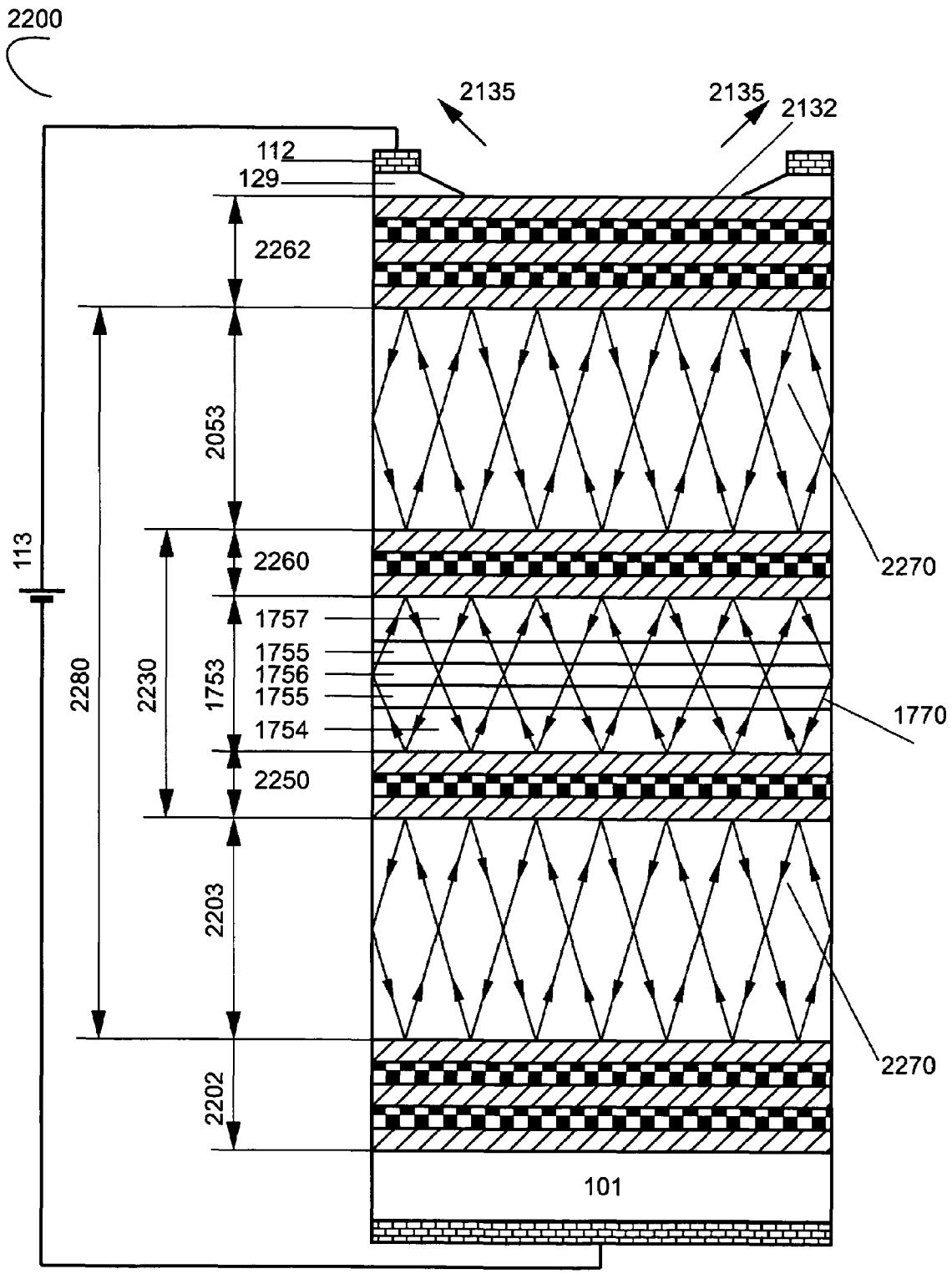
FIG. 22 shows a schematic illustration of an apparatus for generating wavelength-stabilized light according to a thirteenth embodiment of the present invention.

FIG. 22 shows an apparatus (2200) generating wavelength-stabilized laser light according to a thirteenth embodiment of the present invention. The apparatus (2200) is grown epitaxially on a substrate (101) and comprises light-emitting device (2230) inserted in an external cavity (2280). The light-emitting device (2230) comprises a first cavity (1753) sandwiched between a first multilayer interference reflector (MIR) (2260) and a second multilayer interference reflector (MIR) (2250). The external cavity (2280) comprises a first part (2203) of the external cavity contiguous to the light-emitting device (2230) from the substrate side, the light-emitting device (2230), and a second part (2253) contiguous to the light-emitting device (2230) from the side opposite to the substrate side. The first part (2203) of the external cavity (2280) is bounded by the second MIR (2250) and a multilayer interference reflector (MIR) (2202) which may be regarded as a first external mirror with respect to the light-emitting device (2230). The same MIR (2202) may also be regarded as a third multilayer interference reflector of the apparatus (2200). The second part (2253) of the external cavity (2280) is bounded by the first MIR (2260) and a multilayer interference reflector (MIR) (2262) which may be regarded as a second external mirror with respect to the light-emitting device (2230). The same MIR (2262) may also be regarded as a fourth multilayer interference reflector of the apparatus (2200). The apparatus (2200) operates as follows. The light-emitting device (2230) generates light in a plurality of tilted optical modes (1770). Light in these optical modes leaks through the first MIR (2260) into the second part (2253) of the external cavity (2280) and through the second MIR (2250) into the first part (2203) of the external cavity (2280). As illustrated in FIG. 15, phase matching conditions are met, and a positive feedback occurs at one or a few selected wavelengths, at which the dispersion law curve of the optical modes (1770) of the first cavity (1753) intersects with the dispersion law curve of the optical modes (2270) of the external cavity (2280).

Generated wavelength-stabilized laser light comes out (2135) through the top surface of the apparatus (2200). The optical aperture (2132) on the top surface is considerably larger than the wavelength of the emitted light, preferably by the factor of five or more. Then the diffraction of light at the aperture is not very strong, and the far field diagram of the light emission is determined, mainly by the tilt angle of the tilted optical mode, for which phase-matching conditions are met. If the aperture (2132) has a round shape in the lateral plane, the far field diagram of the light emission will be axially symmetric. At each wavelength within the luminescence spectrum, the maximum intensity will be reached at a certain polar angle $\vartheta$ and will be independent of the azimuth $\varphi$, the far field diagram thus having a conical shape. If the aperture (2132) has a less symmetric shape, the far field will be less symmetric as well, containing, for typical embodiments, two or four lobes.

Another embodiment of the present invention is possible, wherein one or both contacts are intracavity contacts.

And yet another embodiment of the present invention is possible, wherein wavelength-stabilized laser light comes out of the apparatus through the substrate.

Figure 23:
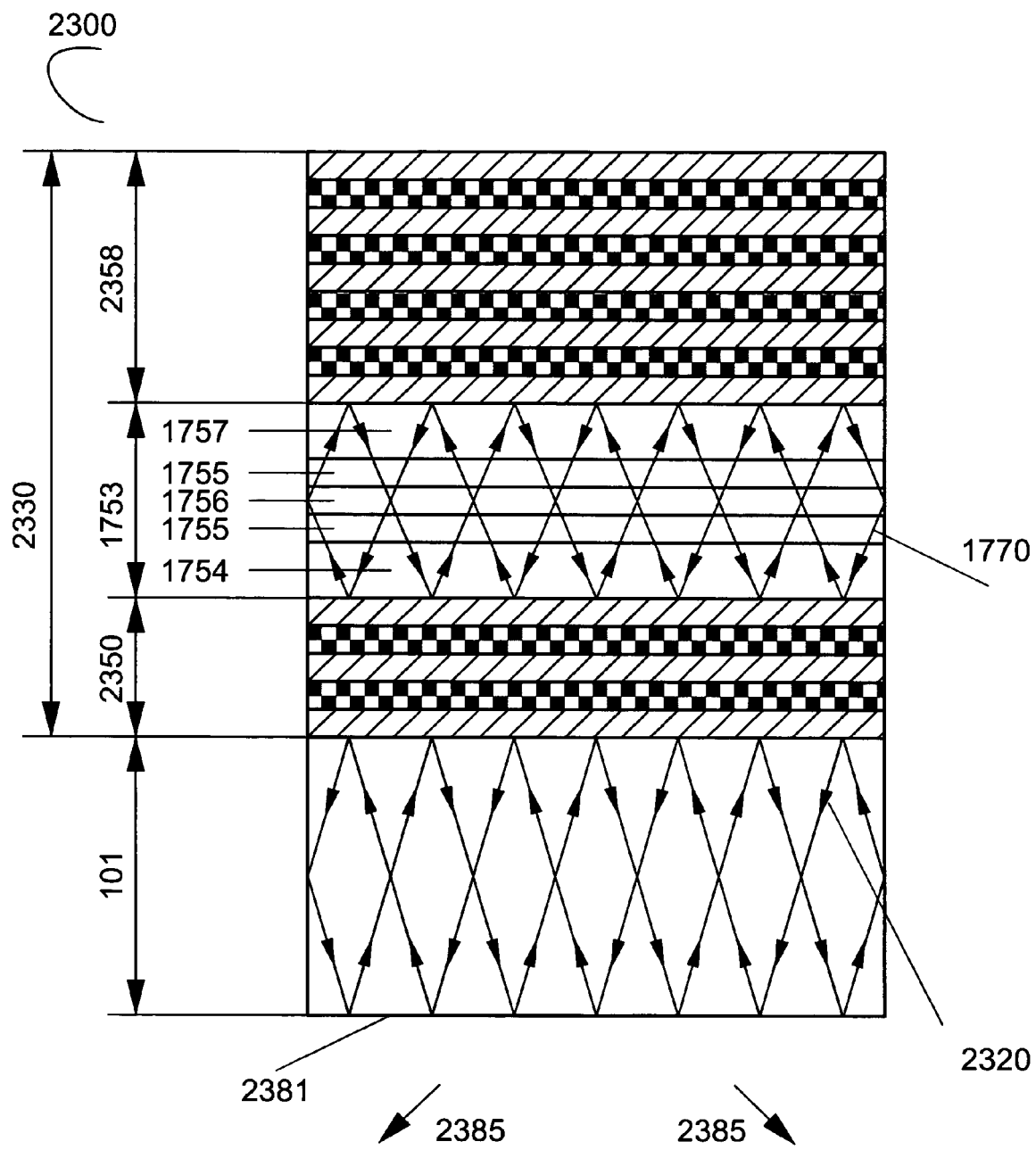
FIG. 23 shows a schematic diagram of an apparatus generating wavelength-stabilized laser light according to a fourteenth embodiment of the present invention, wherein the substrate operates as an external cavity.

FIG. 23 illustrates an apparatus (2300) generating wavelength-stabilized laser light according to a fourteenth embodiment of the present invention. The apparatus (2300) is grown epitaxially on a substrate (101) and comprises a light-emitting device (2330) and a substrate (101). The light-emitting device (2330) further comprises a first cavity (1753)

sandwiched between a first multilayer interference reflector (MIR) (2358) and a second multilayer interference reflector (MIR) (2350). The active region (1756) is placed within the first cavity (1753). The substrate (101) plays a role of the external cavity, and the back surface of the substrate (2381) plays a role of the external mirror. The apparatus (2300) operates as follows. The light-emitting device (2330) generates light in a plurality of tilted optical modes (1770). Light in these modes leaks through the second MIR (2350) to the substrate (101). The substrate (101) provides the oscillations of the phase of the optical wave leaking to the substrate (101), reflecting back from the back surface (2381) of the substrate (101) and propagating back to the active region (1756), as a function of the wavelength. Emission of light is favored at the wavelengths corresponding to the constructive interference of the optical wave propagating through the substrate (101), reflecting from the back surface (2381) of the substrate, and propagating back to the active region. The interaction of the two complex angular-dependent features of two elements, the cavity (1753), and the substrate (101), results in the generation of the wavelength-stabilized laser light, which comes out (2385) of the apparatus (2300) through the back surface (2381) of the substrate (101). As illustrated in FIG. 15, conditions of the constructive interference, or phase-matching conditions for light are met at one, and a positive feedback occurs or a few selective wavelengths, at which the dispersion law of tilted optical modes of the first cavity (1753) intersects with the dispersion law of some of the tilted optical modes (2320) of the substrate (101).

Figure 24:
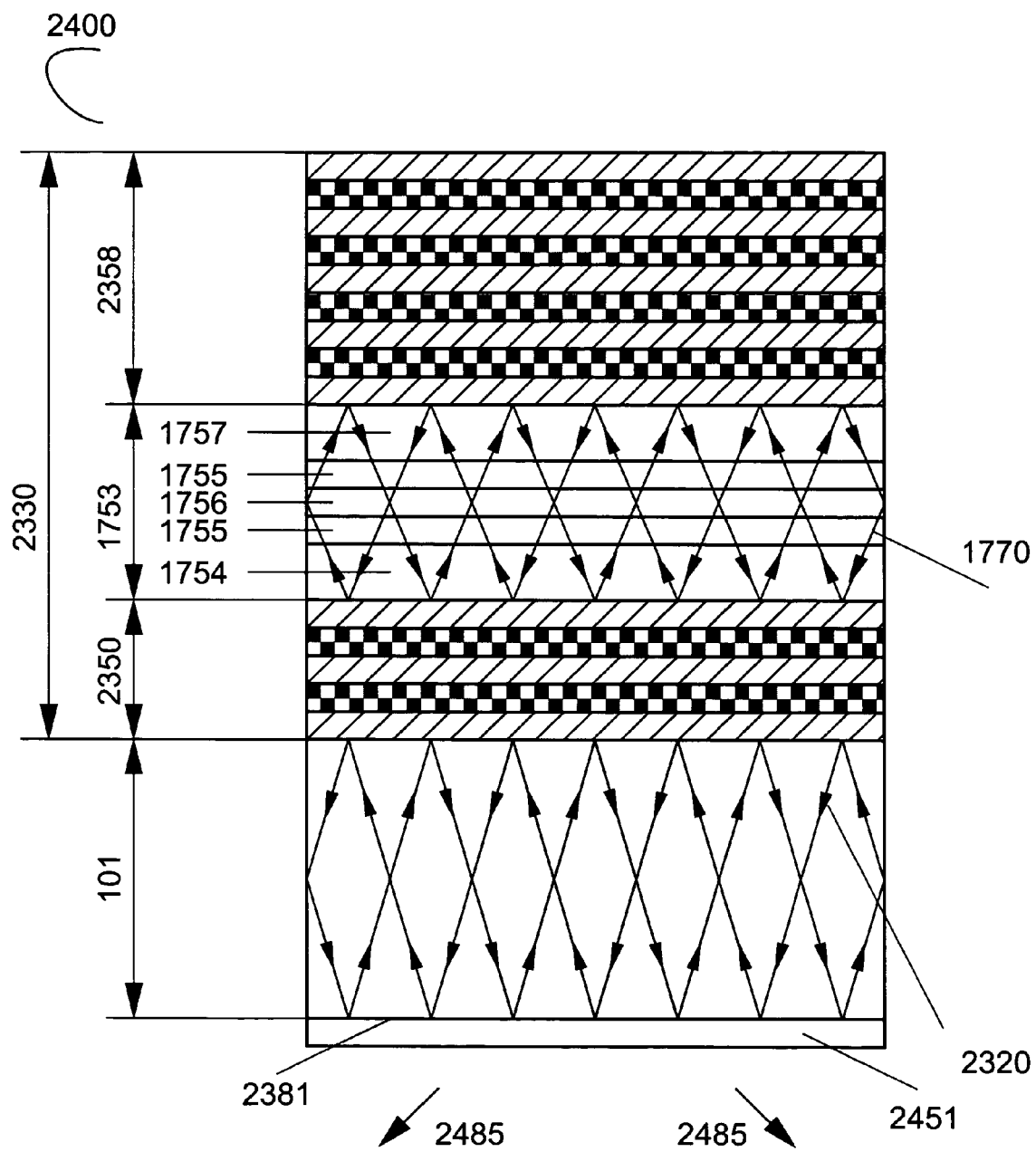
FIG. 24 shows a schematic diagram of an apparatus generating wavelength-stabilized laser light according to a fifteenth embodiment of the present invention, wherein a dielectric layer is deposited for adjusting the resonant wavelength.

FIG. 24 illustrates an apparatus (2400) generating wavelength-stabilized laser light according to a fifteenth embodiment of the present invention. A dielectric layer (2451) is deposited on the back surface (2381) of the substrate (101) to adjust the wavelength of lasing. Wavelength-stabilized laser light (2485) comes out through the back surface (2381) of the substrate (101) and the dielectric layer (2451).

One another embodiment of the present invention is possible, wherein substrate is etched off from the back surface to adjust the wavelength of lasing.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

The present invention should not be understood as limited to the specific embodiments set out above but to include all possible embodiments which are embodied within a scope encompassed and equivalents thereof with respect to the features set out in the appended claims. Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. An apparatus for generating wavelength-stabilized light, comprising:
    a light-emitting device comprising:
        at least one first reflector providing a reflectivity band in a broad wavelength range and a broad range of tilt angles;
        at least one first cavity;
        a planar active element comprising a planar p-n junction, said planar p-n junction comprising an active region, wherein said active region is capable of generating light when nonequilibrium carriers are injected, and wherein said active region has a broad spectral range of photoluminescence;
        an injection device that provides for injection of nonequilibrium carriers into said active region; and
        an exit plane that extends parallel to a plane of said planar p-n junction, wherein generated light exits said light-emitting device through said exit plane in a broad variety of angles deflected from a direction normal to said exit plane and within a range of wavelengths defined by the photoluminescence spectrum of said active region, and wherein said generated light is not wavelength-selective;
    at least one second cavity located adjacent said exit plane at a side of said exit plane opposite to said light-emitting device; and
    at least one second reflector located adjacent said at least one second cavity, wherein the light generated by said light-emitting device and exiting through said exit plane propagates through said at least one second cavity, is reflected by said at least one second reflector, propagates back through said at least one second cavity, and reaches said active region such that phase-matching conditions are met for light which:
        i) exits said light-emitting device at selective angles, wherein the selective angles, defined in a semiconducting material with respect to the direction normal to said exit plane, are larger than five degrees; and
        ii) has a selective wavelength or one of a few selective wavelengths, wherein said selective wavelengths determine a wavelength-stabilized operation of said apparatus, and wherein no phase-matching conditions are met for light exiting said light-emitting device at an angle with respect to the direction normal to said exit plane smaller than five degrees in semiconducting material.

2. The apparatus for generating wavelength-stabilized light of claim 1, wherein said at least one first reflector is selected from the group consisting of:
    a multilayer interference reflector; and
    an evanescent reflector.

3. The apparatus for generating wavelength-stabilized light of claim 1, wherein said light-emitting device is selected from the group consisting of:
    a light-emitting diode;
    a superluminescent light-emitting diode; and
    a semiconductor diode laser.

4. The apparatus for generating wavelength-stabilized light of claim 1, wherein said injection device is selected from the group consisting of:

a photoexcitation device that provides for photoexcitation of the active region; and a current injection device that provides for current injection into the active region.

5. The apparatus for generating wavelength-stabilized light of claim 1, further comprising a substrate.

6. The apparatus for generating wavelength-stabilized light of claim 5, wherein said substrate is located at a position selected from the group consisting of:

a position between said at least one first reflector and said exit plane; and a position at the side of said at least one first reflector opposite to said exit plane.

7. The apparatus for generating wavelength-stabilized light of claim 1, wherein said apparatus for generating wavelength-stabilized light is selected from a group consisting of:

a wavelength-stabilized light-emitting diode;

a wavelength-stabilized superluminescent light-emitting diode; and a wavelength-stabilized semiconductor diode laser.

8. The apparatus for generating wavelength-stabilized light of claim 1, wherein said at least one second cavity is a cavity external to said light-emitting device, and wherein said light-emitting device is optically coupled to said external cavity via a far-field zone.

9. The apparatus for generating wavelength-stabilized light of claim 1, wherein said at least one second cavity is a cavity external to said light-emitting device, and wherein said light-emitting device is optically coupled to said external cavity via a near-field zone.

10. The apparatus for generating wavelength-stabilized light of claim 1, wherein said light-emitting device is optically coupled to said at least one second-cavity epitaxially.

11. The apparatus for generating wavelength-stabilized light of claim 1, wherein phase matching conditions are met for a set of selective wavelengths within the photoluminescence spectrum of said active region.

12. The apparatus for generating wavelength-stabilized light of claim 11, wherein said set of selective wavelengths is a single wavelength.

13. The apparatus for generating wavelength-stabilized light of claim 1, further comprising a grating adjacent to said at least one second cavity.

14. The apparatus for generating wavelength-stabilized light of claim 1, wherein said apparatus providing wavelength-stabilized light is a wavelength-stabilized semiconductor diode laser selected from the group consisting of:

a wavelength-stabilized vertical cavity surface emitting laser;

a wavelength-stabilized tilted cavity surface-emitting laser; and a wavelength-stabilized tilted cavity laser emitting light through a side facet.

15. The apparatus for generating wavelength-stabilized light of claim 10, wherein said at least one second cavity is a substrate.

16. The apparatus for generating wavelength-stabilized light of claim 15, wherein said at least one second reflector is a back side of said substrate.

17. The apparatus for generating wavelength-stabilized light of claim 8, further comprising:

a nonlinear crystal located in said cavity external to said light-emitting device, wherein said wavelength-stabilized light is wavelength-stabilized primary light, and wherein said wavelength-stabilized primary light within said nonlinear crystal is transformed into a wavelength-stabilized second harmonic light.

18. The apparatus for generating wavelength-stabilized light of claim 1, wherein the planar active element is located at a position selected from the group consisting of:

a position within said at least one first reflector;

a position within said at least one first cavity; and a position between said at least one first cavity and said at least one first reflector.

* * * * *